(12) United States Patent
Brown et al.

(10) Patent No.: US 7,804,040 B2
(45) Date of Patent: Sep. 28, 2010

(54) PHYSICAL VAPOR DEPOSITION PLASMA REACTOR WITH ARCING SUPPRESSION

(75) Inventors: Karl M. Brown, Mountain View, CA (US); Semyon Sherstinksy, San Francisco, CA (US); Vineet H. Mehta, Sunnyvale, CA (US); Wei W. Wang, Santa Clara, CA (US); John A. Pipitone, Livermore, CA (US); Kurt J. Ahmann, Seattle, WA (US); Armando Valverde, Jr., San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 602 days.

(21) Appl. No.: 11/438,496

(22) Filed: May 22, 2006

(65) Prior Publication Data

US 2007/0193982 A1 Aug. 23, 2007

Related U.S. Application Data

(63) Continuation-in-part of application No. 11/052,011, filed on Feb. 3, 2005, now Pat. No. 7,399,943.

(51) Int. Cl.
*B23K 9/00* (2006.01)

(52) U.S. Cl. ............................ 219/121.43; 219/121.41; 219/121.52; 118/723 I

(58) Field of Classification Search ............ 219/121.43, 219/121.58, 121.15; 438/10, 548, 795, 689, 438/513, 197, 687; 204/192.13, 298.03, 204/298.02, 298.12, 192.15; 118/712, 697, 118/723 I, 723 R, 728; 156/345.48, 345.38, 156/345.43
See application file for complete search history.

(56) References Cited

U.S. PATENT DOCUMENTS 3,461,054 A 8/1969 Vrantley .................... 204/192

(Continued)

FOREIGN PATENT DOCUMENTS

| EP | 0782172 A2 | 7/1997 |
|---|---|---|
| EP | 0799903 A2 | 10/1997 |
| EP | 0807954 A1 | 11/1997 |

(Continued)

OTHER PUBLICATIONS

Boyle, P.C., et al., "Independent control of ion current and ion impact energy onto electrodes in dual frequency plasma devices", *Journal of Physics D: Applied Physics*, 2004, pp. 697-701, vol. 37, Institute of Physics Publishing, United Kingdom.
Wickramanayaka, Sunil, et al., "Using I-PVD for copper-based interconnects", *Solid State Technology*, Oct. 2002, pp. 67-74.
Official Actions Issued in Related U.S. Appl. No. 11/140,544.

(Continued)

*Primary Examiner*—Quang T Van
(74) *Attorney, Agent, or Firm*—Law Office of Robert M. Wallace

(57) ABSTRACT

A physical vapor deposition reactor includes a vacuum chamber with a sidewall, a ceiling and a retractable wafer support pedestal near a floor of the chamber, and a vacuum pump coupled to the chamber, the retractable wafer support pedestal having an internal electrode and a grounded base with a conductive annular flange extending from the base. A metal sputter target at the ceiling is energized by a high voltage D.C. source. The reactor has an RF plasma source power generator with a frequency suitable for exciting kinetic electrons is coupled to either the sputter target or to the internal electrode of the pedestal. A removable shield protects the sidewall and is grounded by plural compressible conductive tabs dispersed at generally uniform intervals on the annular flange and engaging a bottom edge of the shield whenever the retractable wafer support pedestal is in an unretracted position, each of the uniform intervals being less than a wavelength corresponding to the frequency of the RF plasma source power generator.

19 Claims, 22 Drawing Sheets

U.S. PATENT DOCUMENTS

| | | | |
|---|---|---|---|
| 3,661,758 A | 5/1972 | Jackson et al. | 204/298 |
| 3,669,871 A | 6/1972 | Elmgren et al. | 204/298.12 |
| 4,539,068 A | 9/1985 | Takagi et al. | 156/614 |
| 4,585,537 A | 4/1986 | Nakayama et al. | 427/570 |
| 4,837,185 A | 6/1989 | Yau et al. | 437/228 |
| 4,963,239 A | 10/1990 | Shimamura et al. | 204/192.12 |
| 4,999,096 A | 3/1991 | Nihei et al. | 204/192.3 |
| 5,126,032 A | 6/1992 | Szlzybowski et al. | 204/298.08 |
| RE34,106 E | 10/1992 | Ohmi | 204/298.08 |
| 5,308,793 A | 5/1994 | Taguchi et al. | 437/194 |
| 5,320,728 A | 6/1994 | Tepman | 204/192.12 |
| 5,486,492 A | 1/1996 | Yamamoto et al. | 437/192 |
| 5,507,930 A | 4/1996 | Yamashita et al. | 204/192.15 |
| 5,510,011 A | 4/1996 | Okamura et al. | 204/192.3 |
| 5,556,476 A * | 9/1996 | Lei et al. | 118/728 |
| 5,656,123 A | 8/1997 | Salimian et al. | 156/345 |
| 5,679,625 A | 10/1997 | Ito et al. | 505/476 |
| 5,849,163 A | 12/1998 | Ichikawa et al. | 204/192.23 |
| 5,933,753 A | 8/1999 | Simon et al. | 438/629 |
| 5,933,973 A | 8/1999 | Fenley, Jr. | 33/451 |
| 5,976,327 A | 11/1999 | Tanaka | 204/192.15 |
| 5,986,762 A | 11/1999 | Challener | 356/375 |
| 6,015,594 A | 1/2000 | Yoshikawa | 427/398.1 |
| 6,051,114 A | 4/2000 | Yao et al. | 204/192.3 |
| 6,080,285 A | 6/2000 | Liu et al. | 204/192.12 |
| 6,117,279 A | 9/2000 | Smolanoff et al. | 204/192.12 |
| 6,139,697 A | 10/2000 | Chen et al. | 204/192.15 |
| 6,153,068 A | 11/2000 | Ohmi et al. | 204/298.06 |
| 6,168,690 B1 * | 1/2001 | Jewett et al. | 204/192.12 |
| 6,197,167 B1 | 3/2001 | Tanaka | 204/192.15 |
| 6,221,217 B1 * | 4/2001 | Moslehi et al. | 204/192.12 |
| 6,221,221 B1 * | 4/2001 | Al-Shaikh et al. | 204/298.02 |
| 6,228,236 B1 | 5/2001 | Rosenstein et al. | 204/298.2 |
| 6,232,236 B1 | 5/2001 | Shan et al. | 438/715 |
| 6,251,242 B1 | 6/2001 | Fu et al. | 204/298.19 |
| 6,274,008 B1 | 8/2001 | Gopalraja et al. | 204/192.17 |
| 6,277,249 B1 | 8/2001 | Gopalraja et al. | 204/192.12 |
| 6,287,977 B1 | 9/2001 | Hashim et al. | 438/722 |
| 6,309,978 B1 | 10/2001 | Donohoe et al. | 438/710 |
| 6,350,353 B2 | 2/2002 | Gopalraja et al. | 204/192.3 |
| 6,352,620 B2 | 3/2002 | Yu et al. | 204/192.15 |
| 6,377,060 B1 | 4/2002 | Burkhardt et al. | 324/754 |
| 6,436,251 B2 | 8/2002 | Gopalraja et al. | 204/298.12 |
| 6,444,104 B2 | 9/2002 | Gopalraja et al. | 204/298.13 |
| 6,444,137 B1 | 9/2002 | Collins et al. | 216/79 |
| 6,451,177 B1 | 9/2002 | Gopalraja et al. | 204/192.12 |
| 6,461,483 B1 | 10/2002 | Gopalraja et al. | 204/192.12 |
| 6,462,482 B1 | 10/2002 | Wickramanayaka et al. | 315/111.21 |
| 6,485,617 B2 | 11/2002 | Fu et al. | 204/192.12 |
| 6,485,618 B2 | 11/2002 | Gopalraja et al. | 204/192.12 |
| 6,488,807 B1 | 12/2002 | Collins et al. | 156/345.49 |
| 6,498,091 B1 | 12/2002 | Chen et al. | 438/627 |
| 6,500,762 B2 | 12/2002 | Hashim et al. | 438/687 |
| 6,514,390 B1 * | 2/2003 | Xu et al. | 204/192.12 |
| 6,518,195 B1 | 2/2003 | Collins et al. | 438/723 |
| 6,545,420 B1 | 4/2003 | Collins et al. | 315/111.51 |
| 6,554,979 B2 | 4/2003 | Stimson | 204/298.06 |
| 6,559,061 B2 | 5/2003 | Hashim et al. | 438/722 |
| 6,627,050 B2 | 9/2003 | Miller et al. | 204/192.22 |
| 6,652,718 B1 | 11/2003 | D'Couto et al. | 204/192.3 |
| 6,660,622 B2 | 12/2003 | Chen et al. | 438/595 |
| 6,696,360 B2 | 2/2004 | Ahn et al. | 438/632 |
| 6,709,987 B2 | 3/2004 | Hashim et al. | 438/722 |
| 6,755,945 B2 | 6/2004 | Yasar et al. | 204/192.3 |
| 6,787,006 B2 | 9/2004 | Gopalraja et al. | 204/192.3 |
| 6,860,973 B2 | 3/2005 | Williams et al. | 204/192.13 |
| 7,037,837 B2 | 5/2006 | Grunow et al. | 438/687 |
| 7,214,619 B2 | 5/2007 | Brown et al. | 438/681 |
| 7,244,344 B2 | 7/2007 | Brown et al. | 204/298.11 |
| 2001/0023822 A1 | 9/2001 | Koizumi et al. | 204/298.05 |
| 2001/0050220 A1 | 12/2001 | Chiang et al. | 204/192.12 |
| 2002/0004309 A1 | 1/2002 | Collins et al. | 438/719 |
| 2002/0104751 A1 | 8/2002 | Drewery et al. | 204/192.1 |
| 2003/0116427 A1 | 6/2003 | Ding et al. | 204/192.17 |
| 2003/0124846 A1 | 7/2003 | Chiang et al. | 438/687 |
| 2003/0159925 A1 | 8/2003 | Sako | 204/298.07 |
| 2003/0209422 A1 | 11/2003 | Wang et al. | 204/192.12 |
| 2003/0216035 A1 | 11/2003 | Rengarajan et al. | 438/637 |
| 2004/0025791 A1 | 2/2004 | Chen et al. | 18/728 |
| 2004/0026235 A1 | 2/2004 | Stowell | 204/192.12 |
| 2004/0152301 A1 | 8/2004 | Hashim et al. | 438/652 |
| 2004/0188239 A1 | 9/2004 | Robison et al. | 204/192.1 |
| 2005/0056536 A1 | 3/2005 | Gopalraja et al. | 204/192.12 |
| 2005/0074968 A1 | 4/2005 | Chen et al. | 438/643 |
| 2006/0073283 A1 | 4/2006 | Brown et al. | 438/597 |
| 2006/0073690 A1 | 4/2006 | Brown et al. | 427/457 |
| 2006/0169578 A1 | 8/2006 | Brown et al. | 204/192.12 |
| 2006/0169582 A1 | 8/2006 | Brown et al. | 204/298.1 |
| 2006/0169584 A1 | 8/2006 | Brown et al. | 204/298.2 |
| 2006/0172517 A1 | 8/2006 | Brown et al. | 204/192.12 |
| 2006/0172536 A1 | 8/2006 | Brown et al. | 438/795 |
| 2006/0191876 A1 | 8/2006 | Brown et al. | 204/192.12 |
| 2007/0193982 A1 | 8/2007 | Brown et al. | 219/121.43 |

FOREIGN PATENT DOCUMENTS

| | | |
|---|---|---|
| EP | 0841683 A2 | 5/1998 |
| EP | 0878825 A2 | 11/1998 |
| EP | 1094493 A2 | 4/2001 |
| EP | 1128414 A1 | 8/2001 |
| EP | 1146543 A2 | 10/2001 |
| JP | 01309965 A | 12/1989 |
| JP | 02182873 A | 7/1990 |
| JP | 05148627 A | 6/1993 |
| JP | 07074159 A | 3/1995 |
| WO | WO 9848444 | 10/1998 |

OTHER PUBLICATIONS

Official Actions Issued in Related U.S. Appl. No. 11/140,513.
Official Actions Issued in Related Issued Patent No. 7,244,344.
Official Actions Issued in Related U.S. Appl. No. 11/222,230.
Official Action Dated Dec. 22, 2006 in Related U.S. Appl. No. 11/222,245.
Official Actions Issued in Related U.S. Appl. No. 11/222,231.
Official Actions Issued in Related U.S. Appl. No. 11/222,248.
Official Action Dated Nov. 23, 2009 in Co-Pending U.S. Appl. No. 11/222,238.
Official Action Dated Jan. 26, 2010 Issued in Co-Pending U.S. Appl. No. 11/222,234.
Official Action Dated Jan. 29, 2010 Issued in Co-Pending U.S. Appl. No. 11/222,248.

\* cited by examiner

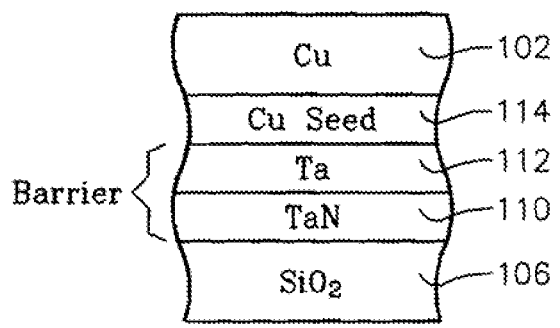
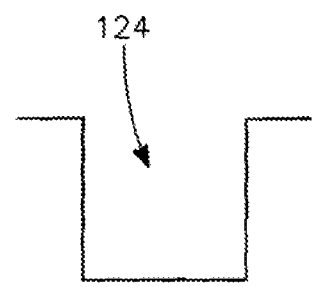
FIG. 7            FIG. 8A
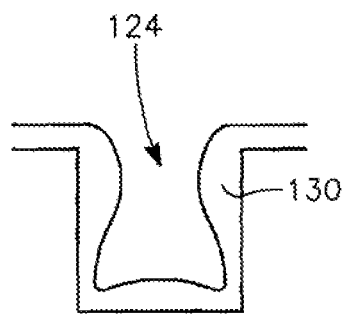
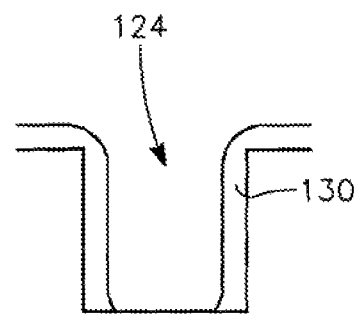
FIG. 8B           FIG. 8C
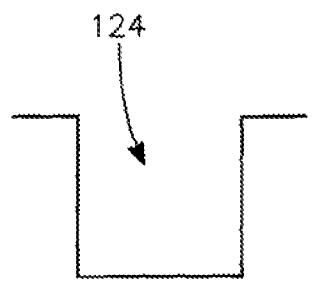
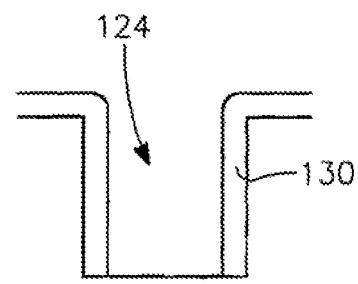
FIG. 9A           FIG. 9B

PHYSICAL VAPOR DEPOSITION PLASMA REACTOR WITH ARCING SUPPRESSION

CROSS-REFERENCE TO RELATED APPLICATIONS

This application is a continuation-in-part of U.S. application Ser. No. 11/052,011 filed Feb. 3, 2005 now U.S. Pat. No. 7,399,943 by Karl M. Brown et al., entitled "APPARATUS FOR METAL PLASMA VAPOR DEPOSITION AND RE-SPUTTER WITH SOURCE AND BIAS POWER FREQUENCIES APPLIED THROUGH THE WORKPIECE" and assigned to the present assignee.

BACKGROUND OF THE INVENTION

With recent technological advances in integrated circuit design, there are now as many as six to ten interconnect layers of a multilayer interconnect structure overlying the semiconductor transistors. Insulator layers separate the successive conductor layers. The conductor interconnect layers can have completely different conductor patterns and are connected to one another and to the transistor layer at different locations through vias extending vertically through the insulator layers. It is the formation of the vias with which the present invention is concerned.

To reduce resistive power losses in the integrated circuit, the interconnect layers and the vias typically employ aluminum and, more recently, copper as the principal conductor. The insulator layers are silicon dioxide, although more recently dielectric materials other than silicon dioxide having a lower dielectric constant are increasingly being employed. Because copper tends to diffuse over time through the insulator layer to cause catastrophic short circuiting, a barrier layer that blocks copper diffusion is placed between the copper material and the dielectric material wherever the two materials interface in the integrated circuit. The barrier layer is typically formed of an underlying tantalum nitride or titanium nitride layer contacting the insulator layer, an overlying pure (or nearly pure) tantalum (or titanium) layer and, finally, a copper seed layer over the pure tantalum (or titanium) layer. If the conductor is to be copper, then tantalum is preferred. The copper conductor is deposited on the copper seed layer. Such a barrier layer prevents migration or diffusion of copper atoms into the dielectric material. The tantalum and tantalum nitride (or titanium and titanium nitride) layers are poor conductors compared to copper. The formation of the barrier layer and of the copper conductors is carried out by physical vapor deposition. Other deposition processes may be employed for the metal fill step (copper deposition) such as chemical vapor deposition, plasma enhanced chemical vapor deposition or electroplating.

A problem arises in forming the vias extending vertically between the horizontal interconnect layers, as follows. Each vertical via opening is formed by etching a hole through an overlying horizontal insulator (silicon dioxide) layer so as to expose a portion of the copper conductor in the underlying horizontal interconnect layer. It is this exposed portion to which connection is to be made through the via. A barrier layer must be deposited on the interior surfaces of the via before the copper conductor can be formed in the via, to prevent copper migration as explained above. This barrier layer, in covering all interior surfaces of the via, covers the exposed portion of the underlying copper conductor. Since the barrier layer is an inferior conductor, it must be selectively removed from the underlying copper conductor (in an etch process) without removing the remainder of the barrier layer from the other interior surfaces of the via. This removal step has required interruption of the physical vapor deposition process in order to place the wafer in an etch chamber where the step of selectively removing the barrier layer from the underlying copper surface is carried out. The wafer is then returned to a physical vapor deposition reactor for formation of the copper conductor(s).

The interruption represented by the selective removal of the barrier layer entails a higher production cost and consumes production time. In recent years, a dual purpose reactor was developed capable of both physical vapor deposition of the barrier layer and selective removal of the barrier layer after the barrier layer formation step, without removing the wafer from the reactor. As a result, great savings in production cost and production time have been realized. This was accomplished by providing in the physical vapor deposition chamber a separate coil near the wafer. After barrier layer formation, the coil is used to form an inductively coupled plasma which selectively sputters the barrier layer from horizontal surfaces (i.e., the floor formed by the underlying copper conductor). Such selective sputtering (hereinafter referred to as "re-sputtering") is achieved by applying RF bias power to the wafer to achieve an ion velocity distribution that is predominantly vertical. While this dual-purpose reactor works extremely well, it does entail some additional expense. For example, since the barrier layer deposition step involves sputtering a metal targets and therefore deposits metal over all interior surfaces of the reactor chamber, the re-sputtering coil must be located inside the chamber so that no metallized surfaces shield the coil or otherwise prevent inductive coupling of RF power from the re-sputtering coil to the plasma. In order to avoid process contamination, the re-sputtering coil is formed of pure tantalum, adding cost. The coil is subject to very large temperature fluctuations during its lifetime, and must be changed periodically. RF power must be coupled to the re-sputtering coil through the vacuum seal of the reactor chamber and through an environment that periodically is completely filled with metal vapor. Therefore, an RF feedthrough must be employed that can tolerate the metal deposition, and whose exterior surfaces are textured to avoid excessive accumulation of deposited materials and flaking, and that can tolerate wide temperature excursions over its lifetime.

Another well-known dual-purpose reactor employs an external inductive coil overlying a portion of the ceiling not blocked by the metal sputter target. One problem is that the metal vapor deposition process can coat the ceiling with metal and thereby block inductive coupling from the coil antenna. A more significant problem is that the RF plasma produced by the coil produces a high proportion of metal ions from the target, so that the wafer bias cannot be optimized for etch selectivity to horizontal surfaces without impacting (de-optimizing) the flux of metal ions/vapor from the target. Therefore, the metal deposition process and the re-sputter process must be performed at separate times.

It should be noted that although such dual purpose reactors are capable of performing both the Ta/TaN barrier layer deposition step and the re-sputtering step, a different reactor is typically employed to perform the subsequent copper deposition step. This is because a high flux of copper ions on the wafer is desired, and the PVD reactor must be specially configured in order for the sputtered copper atoms to self-ionize in a very dense plasma at the copper target. Specifically, a very high D.C. power level (40-56 kwatts) is applied to the copper target and a specially configured magnetron is employed for a more concentrated plasma at the target. Because of the high density of copper ions near the target, it is placed very high above the wafer (390 mm), which limits the copper deposition rate to an acceptable threshold (as well as providing some beneficial collimation of copper neutrals). Typically, however, are large share of the copper ions are deposited on shields in the chamber and otherwise lost while traveling over this long distance.

In addition to the requirement for a copper PVD chamber and a barrier PVD chamber, a third chamber, an etch chamber, must be employed to carry out a pre-deposition cleaning process, since the copper PVD chamber and the barrier PVD/re-sputter chamber are not suitable for clean/etch processes.

Another problem is the tendency of the tantalum and/or tantalum nitride material deposited during formation of the barrier layer to deposit with non-uniform thickness along the via walls, and in particular to accumulate faster near the top corners of the vertical walls and thereby exhibit some tendency toward pinch-off. This makes it necessary to restrict the process window in order to ameliorate such problems. This problem is solved to some extent when, upon completion of the barrier layer deposition process, the re-sputtering process is performed, because the re-sputtering process tends to remove tantalum or tantalum nitride from the tops and corners of the via walls faster than elsewhere, while transferring tantalum (or tantalum nitride) material removed from the horizontal surfaces (floors) of the vias onto the lower portions of the via sidewalls. Nevertheless, it would be beneficial to avoid altogether the initial non-uniform tantalum or tantalum nitride deposition problem, to eliminate any risk of pinch-off, permitting some liberalization of the process window.

It would also be beneficial to avoid the necessity of the internal re-sputtering coil provided at least some of its benefits could be realized in a simpler manner.

The present invention provides benefits at least approaching those afforded by the internal re-sputtering coil without the need for such a coil. The present invention furthermore provides a way of ameliorating or avoiding non-uniform deposition of the barrier layer, and a way of avoiding or minimizing deposition of the barrier layer on the exposed copper conductor surface forming the floor of the via during formation of the barrier layer.

Another problem that is to be solved is that, as technological advances dictate smaller geometries and higher aspect ratios for vias and other features, the degree of ionization of the sputtered material (e.g., copper) must be increased to achieve the requisite conformality of the deposited film. Such an increase in ionization requires greater VHF power applied to the wafer support pedestal. Increased demands on process performance require that the temperature of the workpiece be more precisely controlled, dictating the use of an electrostatic chuck to clamp the wafer to a temperature-controlled surface. Use of an electrostatic chuck limits the amount of VHF power that can be applied to the wafer. This is, in large part, because the electrode to which RF power is applied in the electrostatic chuck typically consists of a small molybdenum mesh within an aluminum nitride puck. The small gauge of the mesh (e.g., 100 microns) greatly limits the efficiency of the mesh as an RF radiator and limits the amount of RF power that can be applied to the mesh to as low as 1.5 kW maximum. The requisite degree of ionization for conformal deposition on high aspect ratio openings of small feature sizes (e.g., 45 nm) can only be achieved with much higher VHF power, e.g., 3.5 kW or higher.

SUMMARY OF THE INVENTION

A physical vapor deposition reactor includes a vacuum chamber with a sidewall, a ceiling and a retractable wafer support pedestal near a floor of the chamber, and a vacuum pump coupled to the chamber, the retractable wafer support pedestal having an internal electrode and a grounded base with a conductive annular flange extending from the base. A metal sputter target at the ceiling is energized by a high voltage D.C. source. The reactor has an RF plasma source power generator with a frequency suitable for exciting kinetic electrons is coupled to either the sputter target or to the internal electrode of the pedestal. A removable shield protects the sidewall and is grounded by plural compressible conductive tabs dispersed at generally uniform intervals on the annular flange and engaging a bottom edge of the shield whenever the retractable wafer support pedestal is in an unretracted position, each of the uniform intervals being less than a wavelength corresponding to the frequency of the RF plasma source power generator.

BRIEF DESCRIPTION OF THE DRAWINGS

FIG. 7 is an enlarged cross-sectional view of a barrier layer formed in the process of FIGS. 6A through 6E.

FIGS. 8A through 8C illustrate the formation of a barrier layer in one embodiment of a process of the invention.

FIGS. 9A and 9B illustrate the formation of a barrier layer in the preferred embodiment of a process of the invention.

DETAILED DESCRIPTION OF THE INVENTION

Figure 1:
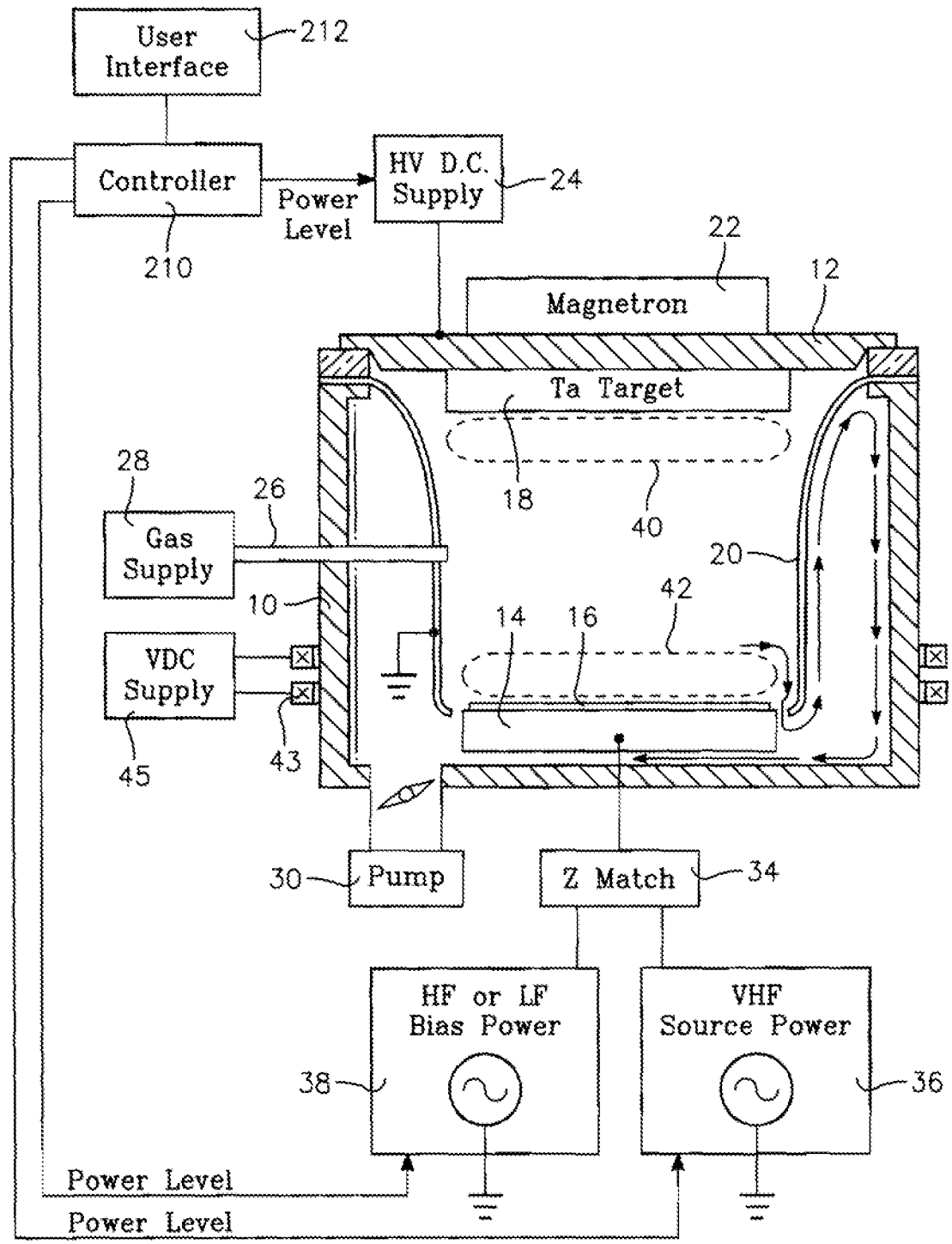
FIG. 1 is a cut-away side view of a plasma reactor embodying the invention.

A plasma reactor forms barrier layers (such as a tantalum/tantalum nitride film or titanium/titanium nitride film) for conductors (such as copper, for which the barrier should be tantalum/tantalum nitride) in trenches or through vias between successive interconnection layers of an integrated circuit. The plasma reactor is capable of both physical vapor deposition and of highly selective re-sputtering to remove barrier material from the exposed horizontal surfaces of the underlying conductor constituting the floor of the via. Significantly, the reactor accomplishes all this without an internal coil that had previously been required for a fully and precisely controllable re-sputtering step. Instead, a plasma is formed near the wafer to perform the re-sputtering step. For this purpose a process gas such as argon may be introduced and source power is applied to the wafer at an RF frequency effective for capacitively coupling energy to kinetic electrons to excite argon plasma ions near the wafer. The term "source power" as employed in this specification refers to RF power suitable for maintain an RF-coupled plasma by coupling power to kinetic electrons in the plasma. This is to be distinguished from use of the term "source" when referring to the D.C. excited metal sputtering target, which is the "source" of the metal atoms or ions in a metal deposition process. Typically, the source power frequency is a VHF frequency because of the low mass-to-charge ratio of electrons. The ions of the VHF-coupled plasma formed near the wafer are employed in the re-sputtering step. The selectivity of the re-sputtering step for horizontal surfaces is established by applying bias power to the wafer at an RF frequency effective for coupling energy to the ions (e.g., argon ions), which is typically an HF or LF frequency because of the high mass-to-charge ratio of the ions. This constricts the ion velocity distribution across the plasma sheath at the wafer surface to a small directional range about the chamber axis, typically a vertical direction, making the re-sputtering step highly selective for surfaces perpendicular to the chamber axis, typically horizontal surfaces. A significant feature is that the bias power controls the selectivity of the ion re-sputter or etch step without affecting the flux of metal atoms from the target toward the wafer. This is facilitated by a low power (2-5 kW) D.C. discharge plasma at the target surface which produces primarily neutral metal particles or atoms from the target that are unaffected by the bias power applied to the wafer. Thus, two different plasmas are employed, one being a D.C. discharge plasma at the target and the other being an RF (VHF) plasma at the wafer. Therefore, the target sputtering may be optimized without affecting the re-sputtering plasma at the wafer, while the bias voltage may be optimized without affecting the target sputtering. This feature is not possible in conventional ion physical vapor deposition reactors that employ RF coupled plasmas near the target to produce metal ions for the physical vapor deposition process.

An advantageous mode is provided that is unique to the present invention in which the physical vapor deposition and the re-sputtering can be performed simultaneously, and the selectivity of the re-sputter or etch process is adjusted without affecting the flux of metal atoms from the target.

The re-sputtering step tends to compensate for non-uniform deposition of the barrier layer material. Therefore, in one embodiment of the invention, the re-sputter step is performed simultaneously with the barrier deposition step. This is possible because a preferred embodiment of the invention produces two somewhat independent plasmas, namely a D.C. discharge plasma near the ceiling or target that is confined by a magnetron above the target and an RF plasma near the wafer surface to perform the re-sputtering. Thus, the plasma near the ceiling is optimized for sputtering the target while (simultaneously) the plasma at the wafer is optimized for re-sputtering and selectively etching the floor of each via. One advantage is that prominent non-uniformities in the deposited barrier layer film are reduced or are never formed, thereby reducing the risk of pinch-off or other problems in the vias. Another advantage of this embodiment is that throughout the entire barrier deposition/re-sputter process, accumulation of barrier material can be entirely avoided on the exposed horizontal surface of the underlying conductor forming the floor of the via. This is accomplished by adjusting the barrier material deposition rate (controlled largely by the tantalum target D.C. sputter voltage) relative to the re-sputter rate (controlled largely by the VHF plasma source power applied to the wafer.)

The invention can afford certain advantages depending upon it application. For example, a low power (2-5 kW) D.C. power level is employed to sputter the metal target for all deposition process, including copper, tantalum and titanium, because metal neutrals are desired. Therefore, the target height above the wafer and the magnetron design are the same in all these processes, so that the same chamber can perform any or all of them. The target height above the wafer can be relatively low, or between about 225 mm and 290 mm, for example. In addition, the VHF source power applicator and the HF bias power applicator can be used without a target to excite a plasma (such as argon plasma) to perform a pre-deposition clean process prior to each deposition process. Such a pre-clean process can be repeated prior to each and all of the deposition steps, including the barrier metal (tantalum) deposition step, the barrier dielectric (tantalum nitride) barrier deposition step, the copper seed layer deposition step and the copper conductor deposition step.

Reactor Apparatus:

Referring to FIG. 1, a reactor of a first embodiment of the invention includes a vacuum chamber defined by a cylindrical side wall 10, a disk-shaped ceiling 12, and a wafer support pedestal 14 for supporting a semiconductor wafer 16 to be processed. A target 18 of a metal (e.g., tantalum) to be deposited on the wafer 16 is mounted on the ceiling 12. A process kit consisting of a cylindrical shield 20 surrounds the wafer 16 and the target 18. A magnetron 22 of the conventional type overlies the target 18 on the external side of the ceiling 12. A high voltage D.C. source 24 is coupled to the target 18. A process gas injector 26 furnished process gas from a supply 28 into the interior of the chamber. A vacuum pump 30 maintains a desired sub-atmospheric pressure in the vacuum chamber.

The wafer pedestal 14 is coupled through an impedance match network 34 to a VHF plasma source power generator 36 and to an HF or LF plasma bias power generator 38. The high voltage D.C. source maintains an upper plasma 40 near the target 18. The VHF plasma source power generator 36 maintains a lower plasma 42 at or near the surface of the wafer 16. The two plasmas 40, 42 may be maintained simultaneously or may be produced at different times. The upper plasma 40 is a D.C. discharge plasma that enables sputtering of the target 18 to produce mainly neutral metal atoms from the target 18 that deposit on the wafer, with some metal ions from the target 18. The lower plasma 42 is a capacitively coupled RF plasma that promotes selective etching of horizontal surface on the wafer 16. The two plasmas 40, 42 may be controlled independently, for separate control of the metal deposition process and the re-sputter process. The LF bias power applied to the wafer determines the selectivity of the re-sputter/etch process for horizontal surfaces. Plasma uniformity, particularly uniformity of the plasma 42 nearest the wafer, is controlled by an electromagnetic coil 43 wrapped around the cylindrical sidewall of the reactor chamber and supplied with D.C. current by a current source controller 45.

Figure 2:
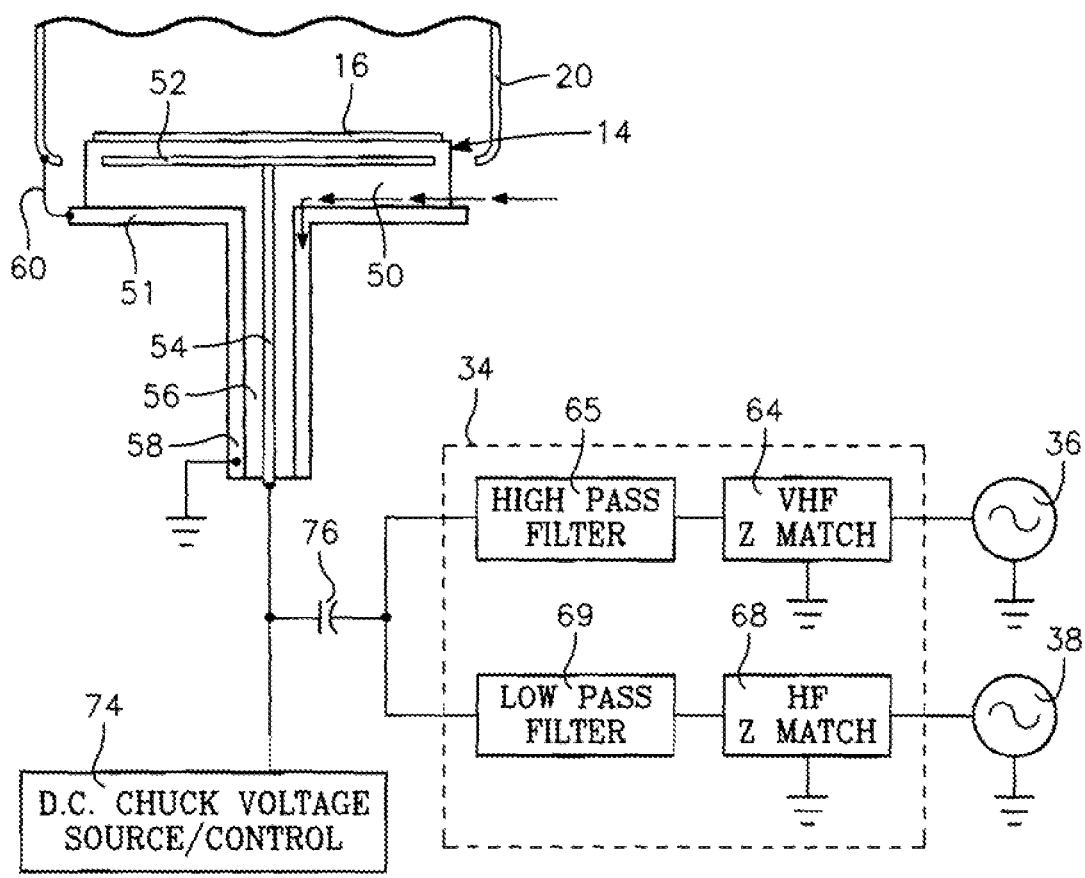
FIG. 2 is an enlarged cut-away view of a wafer support pedestal in accordance with one aspect.

Coupling of the VHF source power and HF or LF bias power to the wafer is illustrated in FIG. 2. The wafer support pedestal 14 can be an electrostatic chuck (ESC) for electrostatically holding the wafer 16 in place. In this case, the ESC or pedestal consists of an insulating layer 50 mounted on a conductive base 51 and an electrode 52 such as a conductive mesh buried inside the insulating layer 50. The pedestal structure can extend downwardly in a coaxial arrangement consisting of a center conductor 54 connected to the electrode 52, an insulating intermediate layer 56 and an outer conductor 58 connected to the conductive base 51. The conductive base can be coupled to the bottom of the cylindrical shield 20 by conductive tabs 60 to provide a more continuous ground reference. The center conductor 54 is coupled to the RF power sources while the outer conductor 58 is grounded. The impedance match network 34 consists of a conventional impedance match circuit 64 coupled to the RF (VHF) plasma source power generator 36 and a conventional impedance match circuit 68 coupled to the RF (HF or LF) plasma bias power generator 38. The output of the impedance match circuit 64 is connected through a high pass filter 65 to the wafer pedestal center conductor 54, while the output of the impedance match circuit 68 is connected through a low pass filter 69 to the wafer pedestal center conductor 54. In addition, a D.C. chuck voltage source 74 is connected to the wafer pedestal center conductor 54 and is isolated from RF power by an isolation capacitor 76. The high pass filter 65 has a sufficiently high cut-off frequency to prevent HF or LF current from the RF generator 38 from reaching the VHF match circuit 64, while the low pass filter has a sufficiently low cut-off frequency to prevent VHF current from the RF generator 36 from reaching the HF (or LF) match circuit 68.

Figure 3:
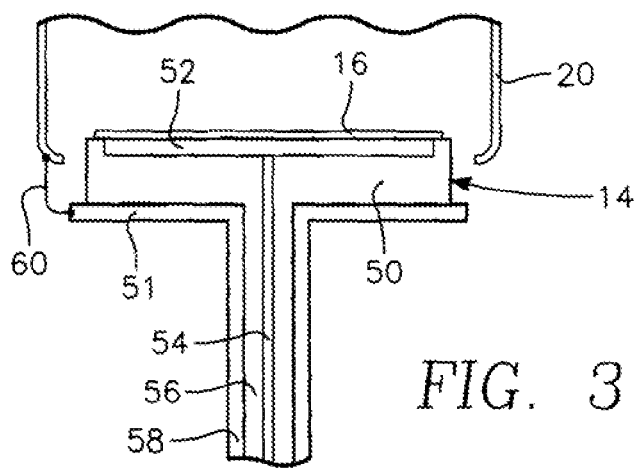
FIG. 3 is an enlarged cut-away view of a wafer support pedestal in accordance with another aspect.

FIG. 3 illustrates another embodiment of the wafer support pedestal 14 in which the electrode 52 contacts the wafer, and there is no electrostatic chucking of the wafer. In this case, since the electrode 52 is potentially exposed to the plasma, the electrode 52 can be formed of the material to be deposited on the wafer, such as tantalum.

Figure 4:
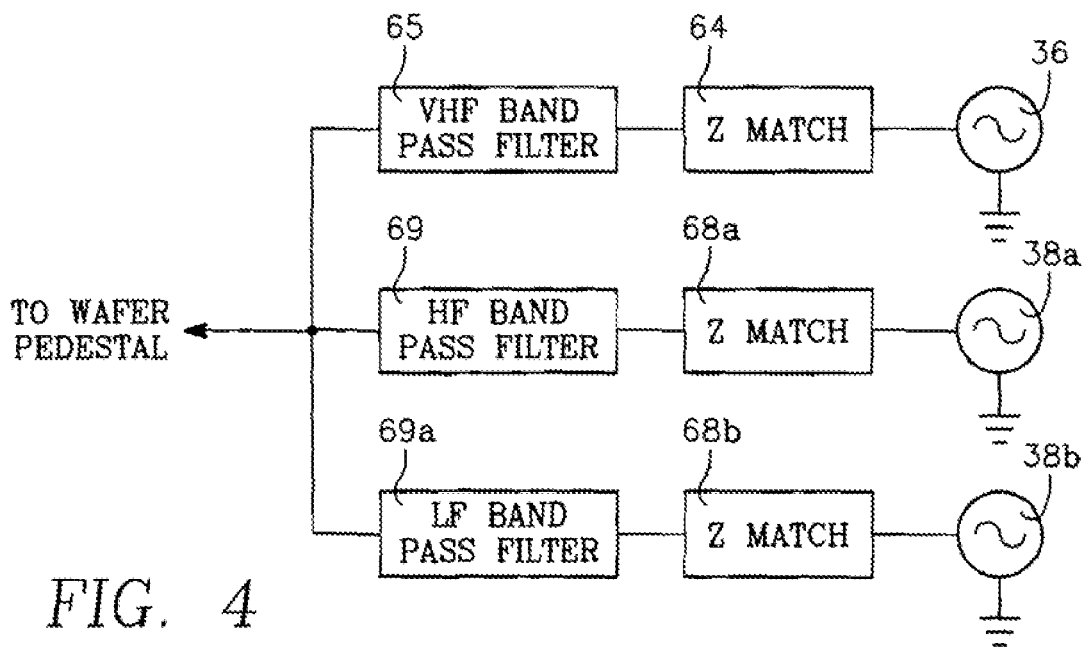
FIG. 4 illustrates the use of two different plasma bias power frequencies in the reactor of FIG. 1.
Figure 5:
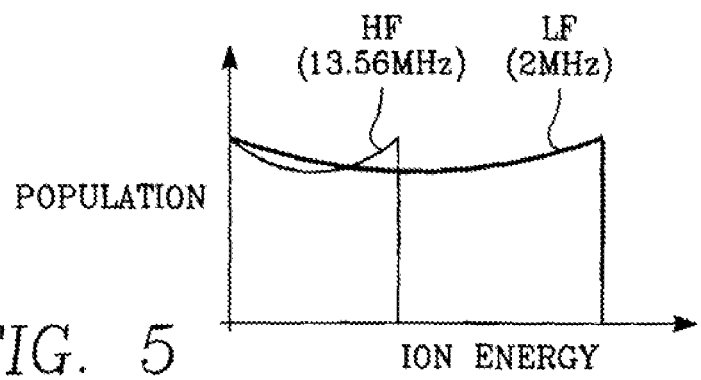
FIG. 5 is a graph illustrating the combination of the different ion energy distributions of the different bias power frequencies in the embodiment of FIG. 4.

FIG. 4 illustrates an embodiment in which the bias power consists of both HF and LF frequencies (e.g., 13.56 MHz and 2 MHz, respectively, for example). For this purpose, there are two bias power RF generators, namely an HF bias power generator 38a and an LF bias power generator 38b, the generators 38a, 38b being coupled through respective match circuits 68a, 68b and filters 69, 69a to the wafer pedestal center conductor 54. The VHF source power generator 36 is coupled through its impedance match circuit 64 and through the high pass filter 65 to the wafer pedestal center conductor 54. One advantage of this embodiment is that the lower ion energy distribution of the HF bias and the higher ion energy distribution of the LF bias (both shown in FIG. 5) can be combined to produce an ion energy distribution that peaks between the peaks of the LF and HF ion energy distributions. This peak can be shifted up or down in energy by adjusting the relative power levels of the LF and HF power generators 38a, 38b.

The deposition rate of the target material (e.g., tantalum) is mainly determined by the power delivered by the D.C. voltage source to the target. The selectivity of the etch/re-sputter process (for horizontal surfaces) is determined by the bias power, while the rate of the etch/re-sputter process is mainly determined by the source power level. Therefore, there are three parameters that can be controlled independently of one another, namely metal deposition rate, etch selectivity for horizontal surfaces and etch rate. Since all these can be controlled independently of one another, the metal deposition and etch/re-sputter process may be performed simultaneously, if desired.

PVD/Re-Sputter Method:

The reactor of FIG. 1 is particularly useful in the formation of metal contacts between successive interconnection layers of an integrated circuit. Typically, an integrated circuit includes an active semiconductor layer having thousands of transistors and many insulated interconnection layers stacked over the active semiconductor layer and providing complex interconnection circuits among the transistors. The connections between interconnection layers are formed through vias or vertical holes between the interconnection layers by filling the holes with a metal such as copper. In order to prevent failure by short circuiting due to diffusion of copper through insulating material, a barrier layer of tantalum and tantalum nitride is placed between the copper and the insulating material. It is in the deposition of the barrier layer within the via that the reactor of FIG. 1 provides great advantage.

Figure 6A:
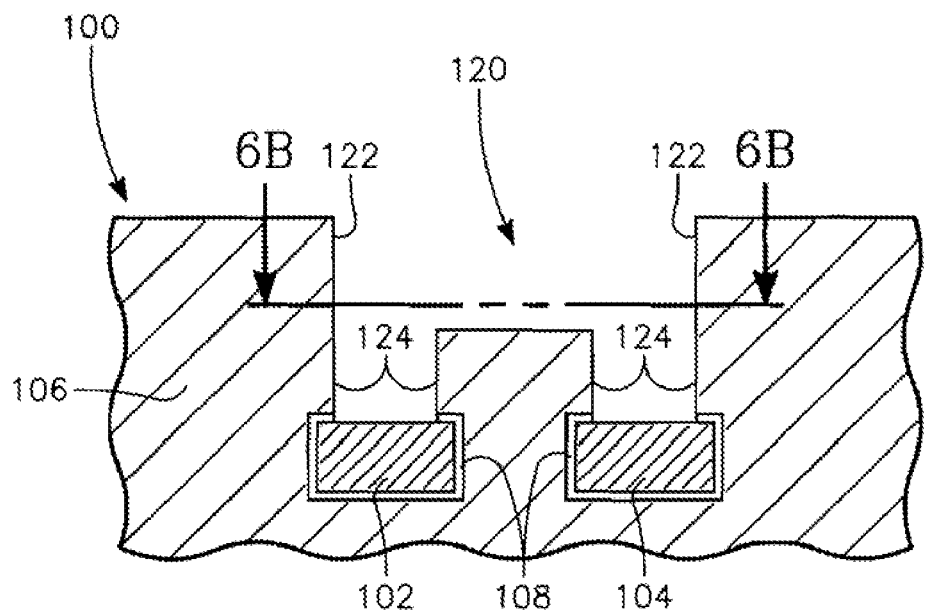
FIGS. 6A through 6E are sequential cross-sectional views of a portion of an integrated circuit, in accordance with a process of the invention.
Figure 6B:
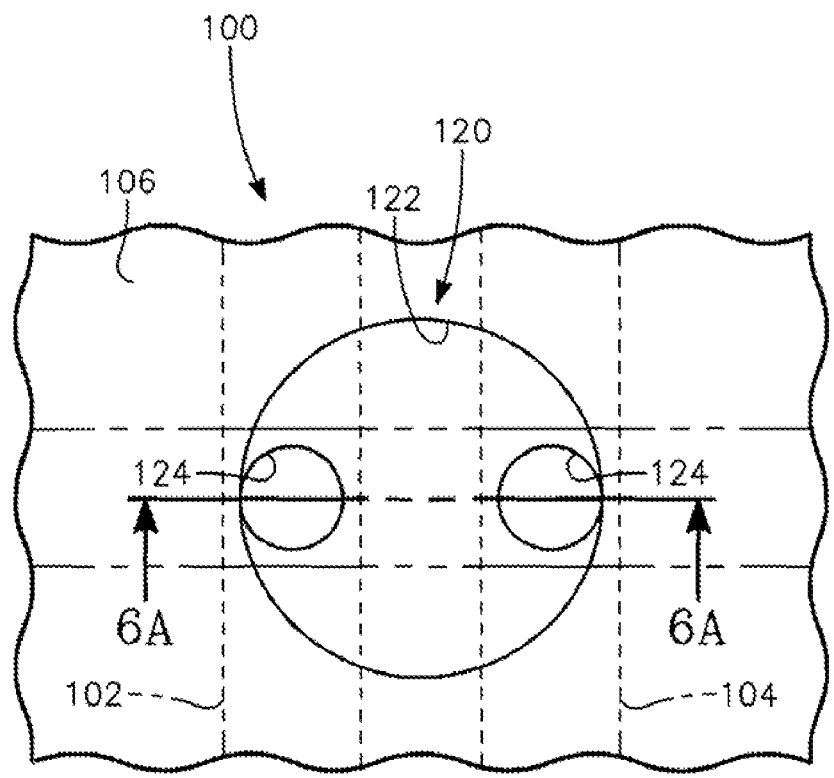

FIG. 6A is an enlarged cross-sectional side view of a partially fabricated portion of an interconnection layer 100 in a stack of many interconnection, layers overlying an active semiconductor layer (now shown). FIG. 6B is the corresponding top view. The interconnection layer 100 includes, among many conductors, a pair of parallel copper conductors 102, 104 embedded in an insulator (silicon dioxide) layer 106. Each copper conductor 102, 104 is separated from the dielectric layer 106 by a barrier layer 108 that prevents diffusion of copper atoms into the dielectric layer 106. Preferably, the barrier layer 108 includes a tantalum nitride layer contacting the insulator layer 106 and covered by a tantalum layer and a copper seed layer. The structure is best shown in the enlarged view of FIG. 7, which shows a tantalum nitride layer 110 covering the insulator layer 106, a tantalum metal layer 112 overlying the tantalum nitride layer 110 and a copper seed layer 114 overlying the tantalum metal layer 112. A copper conductor, such as the copper conductor 102, overlies the copper seed layer 114. The tantalum metal layer 112 establishes a high quality bond with the tantalum nitride layer 110, while the copper seed layer establishes a high quality bond with the tantalum metal layer 112 on one side and the copper conductor 102 on the opposite side.

Before the next interconnection layer is formed on the top surface of the insulator layer 106, a vertical opening or via 120 is opened through the insulator layer 106, typically by etch processes (FIGS. 6A and 6B). The via 120 consists of a large opening 122 extending only partly through the insulator layer 106 and a pair of smaller openings 124 extending down to the respective copper conductors 102, 104. Typically, the etching process that forms the two smaller openings 124 is carried out sufficiently to remove the exposed portion of the barrier layer 108 overlying each conductor 102, 104 (FIG. 6A).

Figure 6C:
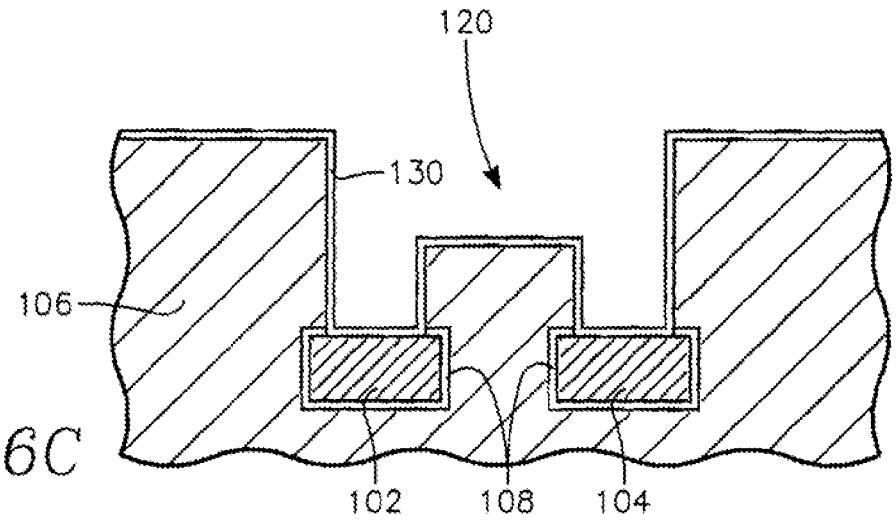

The via 120 forms a vertical conductor when later filled with copper. However, before copper is deposited into the via 120, a barrier layer 130 is deposited onto all surfaces in the via 120 and onto the top surface of the insulator layer 106 as shown in FIG. 6C. The barrier layer 130 has the same structure as that described above with reference to FIG. 7, including a tantalum nitride layer 110, a metal tantalum layer 112 and a copper seed layer 114. In one embodiment of the invention, each sub-layer 110, 112, 114 of the barrier layer 120 is deposited in a separate step by providing the appropriate material for the metal target 18 (tantalum for the sub-layers 110, 112 and copper for the sub-layer 114). The target 18 is sputtered by introducing a process gas which is ionized in the vicinity of the target by the large D.C. sputtering voltage from the sputter voltage source 24. In order to deposit the tantalum nitride sub-layer 110, nitrogen is employed as the process gas, and the tantalum atoms combine with nitrogen atoms as they impact the wafer to form a tantalum nitride film. When depositing the metal tantalum layer 112 and, later, when depositing the copper seed layer 114, the process gas is an inert or non-reactive gas, such as Argon. Thus, three deposition steps are carried out. First, using a tantalum sputtering target and nitrogen process gas, tantalum nitride is deposited. Second, using a tantalum target and argon process gas, metallic tantalum is deposited. Third, using a copper target and argon gas, a copper seed layer is deposited.

In one embodiment of the invention, no plasma RF (VHF) source power is applied to the wafer support pedestal 14, although a modest level of plasma RF (HF or LF) bias power may be applied. In this way, metal is sputtered from the target 18 and deposited onto the wafer 16. As a result, the barrier layer 130 is formed by carrying out the three deposition steps for the successive sub-layers 110, 112, 114. The barrier layer 130 covers all exposed surfaces including the portions of the copper conductors 102, 104 exposed by the small openings 124, as shown in FIG. 6C.

Figure 6D:
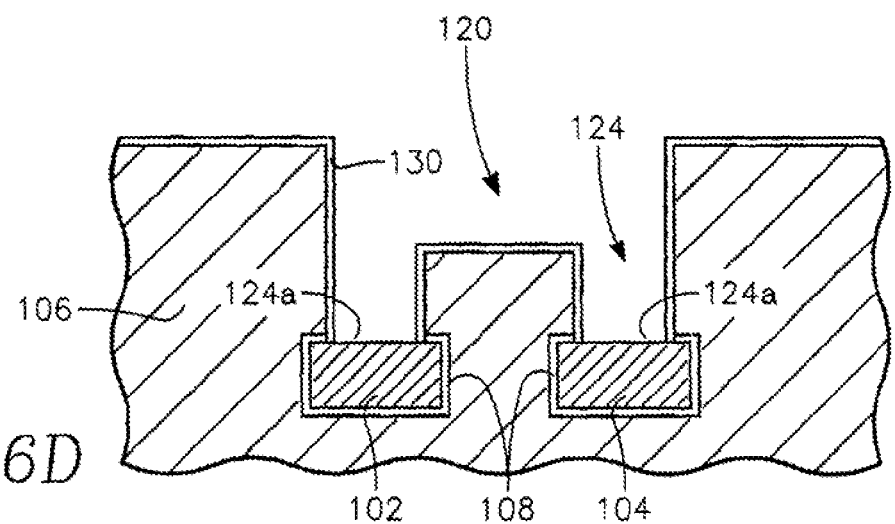

After each of the three deposition steps have been completed, an etch/re-sputter step is carried out (FIG. 6D) in which the VHF plasma source power generator 36 and the HF (or LF) plasma bias power generator 38 deliver power to the wafer support pedestal 14. This produces a plasma near the wafer that furnishes ions guided to the horizontal surfaces by the applied plasma bias power. These ions sputter the horizontal surfaces to remove films deposited thereon, such as the portion of the barrier layer 130 at the bottom of the small openings 124. Within the small openings 124, the close proximity of the vertical walls (or small diameter of the openings 124) promotes the re-deposition of atoms sputtered from the floor 124a of each opening 124 onto the vertical side wall. This uncovers the copper conductors, as desired, as illustrated in FIG. 6D. In other areas where there is no vertical wall, such as the vast area of the top surface of the insulator layer 106, the sputtered atoms re-deposit onto the horizontal surface, so that there is no net loss.

In a preferred embodiment, each of the three deposition process steps (corresponding to the three layers 110, 112, 114) is performed simultaneously with the etch and re-sputter process step. In this preferred embodiment, the sputter voltage source 24 delivers power to the target 18, while simultaneously the VHF plasma source power generator 36 and the HF (or LF) plasma bias power generator 38 deliver power to the wafer support pedestal 14. This produces a plasma near the wafer that furnishes ions guided to the horizontal surfaces by the applied plasma bias power while atoms from the target 18 are being deposited. Deposition of atoms from the target 18 on the horizontal surfaces such as the exposed portions of the copper conductors 102, 104 is avoided provided the etch rate on the horizontal surfaces rival the deposition rate of atoms from the target 18. This condition is realized by an appropriate adjustment of the voltage of the D.C. sputter voltage source 24 (to adjust the deposition rate) and of the power level of the VHF source power generator 36. The power level of the HF (or LF) bias power generator 38 is adjusted to achieve the desired degree of etch selectivity for horizontal surfaces. The result is that the barrier layer 130 is not formed over the horizontal floor of the via 120, so that the process sequence skips the state illustrated in FIG. 6C.

Figure 6E:
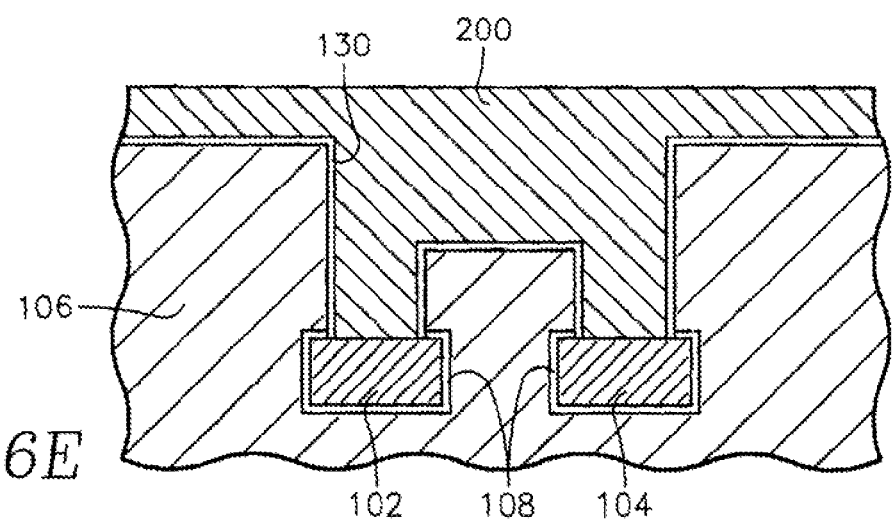

The next step (FIG. 6E) is to deposit a thick copper layer to form the next interconnect layer 200 and vertical conductors extending through the via 120 between the lower interconnect conductors 102, 104 and the upper interconnect layer 200, as shown in FIG. 6E.

The sequence illustrated in FIGS. 8A through 8C shows one advantage of the re-sputtering step of FIG. 6D. FIG. 8A illustrates one of the small openings 124 prior to deposition of the barrier layer 130. FIG. 8B shows how the barrier layer 130 is formed in cases where the re-sputtering step is not carried out simultaneously with the deposition step. Specifically, the barrier layer 130 tends to accumulate with greater thickness near the top edge of the small opening 124 and with smaller thickness near the bottom of the opening 124. The re-sputtering step removes the excess material from the top edge and removes the material from the floor of the small opening and re-deposits it on the vertical side wall, so that the thickness distribution along the vertical side wall becomes more uniform, as indicated in FIG. 8C. The problem is that the thicker accumulation of barrier material near the top edge of the small opening 124 may lead to pinch-off, so that the re-sputter step could have no beneficial effect, the device would fail.

This risk is avoided in the preferred method in which the re-sputter step (FIG. 6D) and the deposition step (FIG. 6C) are carried out simultaneously. In this preferred mode, the process begins with a newly formed small opening 124 in FIG. 9A and transitions directly to a uniform barrier layer 130 in FIG. 9B. The simultaneous deposition/re-sputtering prevents the deposition process from forming significant non-uniformities in the barrier layer 130. This eliminates the risk of the pinch-off effect illustrated in FIG. 8B.

Figure 10:
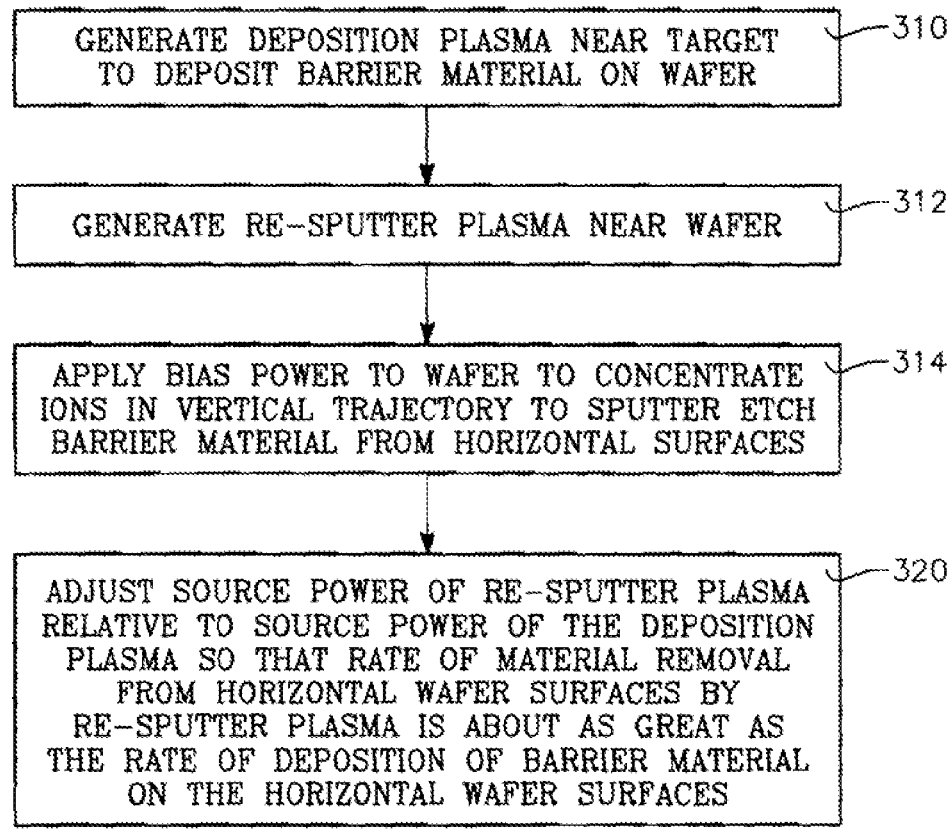
FIG. 10 is a block flow diagram of a preferred process of the invention.

FIG. 10 is a block diagram illustrating the preferred process. In block 310 of FIG. 10, a deposition D.C. discharge plasma is generated around the target 18 (near the ceiling) to deposit atoms from the target onto the wafer. In block 312, a re-sputter capacitively coupled RF plasma is generated near the wafer to produce ions to bombard the wafer to re-sputter the deposited atoms from the target 18. In the step of block 314, plasma RF bias power is applied to the wafer. The bias power is sufficient to render the sputtering highly selective for horizontal surfaces. In block 320, the plasma source power applied to the wafer and the D.C. sputter voltage applied to the target are adjusted relative to one another so that the re-sputter rate is at least nearly as great as the sputter deposition rate.

Figures 11A, 11B, 11C:
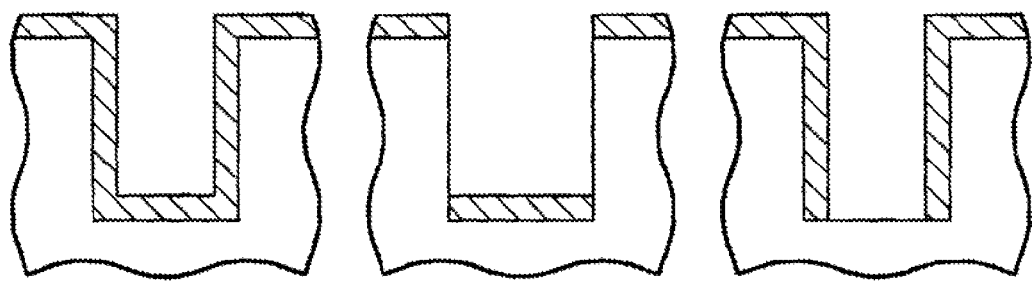
FIGS. 11A, 11B and 11C are cross-sectional side views of an narrow opening through a dielectric layer, and depict deposition results in three respective modes of the reactor of FIG. 1, namely a conformal mode; a non-conformal mode and a punch-through mode, respectively.

One embodiment of the PVD/re-sputter reactor of the invention is capable of depositing three different type of layers by operating in three different modes, specifically, in mode (A), a highly conformal layer with uniform sidewall and horizontal surface coverage, in mode (B), a non-conformal layer with little or no sidewall coverage, and in mode (C), a "punch through" layer with good sidewall coverage and good horizontal surface coverage in a large field, but no coverage of bottom surfaces of high aspect ratio openings. The conformal layer of mode (A), illustrated in FIG. 11A, is obtained by applying a relatively low level of D.C. power to the target (e.g., 5 kW), high VHF source power to the wafer (1 kW at 60 MHz) and a low level of HF bias power to the wafer (about 100 W at 13.56 MHz). The non-conformal layer of mode (B), illustrated in FIG. 11B, is obtained under the same conditions except that the HF bias power level is reduced to zero. The "punch-through" layer of mode (C), illustrated in FIG. 11C, is obtained by increasing the bias power to a high level (500 W at 13.56 MHz). The conformal mode is particularly useful for depositing the copper conductor layer. The non-conformal mode is particularly useful for covering the bottom or floor of a via with a low-resistance metal such as tantalum or titanium. The punch-through mode is the preferred mode for depositing the barrier layer (Ta and TaN) in a via.

In some cases, the plasma density distribution may differ between the three modes described above. In order to maintain more uniform plasma density distribution, the current source controller 45 may cause different levels of D.C. current to flow through the electromagnet coil 43 in different ones of the three modes. In any case, the current level furnished by the current controller 45 is preferably optimized to improve the radial plasma ion density uniformity in the process zone.

Each of the three modes described above with reference to FIGS. 11A, 11B and 11C may be implemented by a process controller 210 shown in FIG. 1 whose outputs control the power level of the target high voltage D.C. supply 24, the power level of the VHF plasma source power generator 36 and the power level of the HF or LF bias power generator 38. The process controller 210 may be controlled by a user through a user interface 212, allowing the user to program the controller to have the reactor of FIG. 1 automatically transition between any of the operating states defined above for the conformal mode, the non-conformal mode and the punch through re-sputter mode. The process controller (or processor) 210 therefore has three states to which the user may set or program the processor 210 to enter into. One state is the conformal deposition mode in which the processor 210 sets the D.C. power level of the supply 24 to a low level, sets the power level of the VHF generator 36 to a high level and the HF/LF bias generator 36 to a low level. The another state is the non-conformal mode in which the processor 210 sets the D.C. power level of the supply 24 to a low level, sets the power level of the VHF generator 36 to a high level and the HF/LF bias generator 38 to zero (or nearly zero) level. The remaining state is the punch through state in which the processor 210 sets the D.C. power level of the supply 24 to a low level, sets the power level of the VHF generator 36 to a high level and the HF/LF bias generator 38 to a high level.

The processor 210 may also govern the electromagnet current source 45, so that in each of the three modes (FIGS. 11A, 11B, 11C), the current level is optimized for a more uniform radial distribution of plasma ion density distribution.

Figure 12:
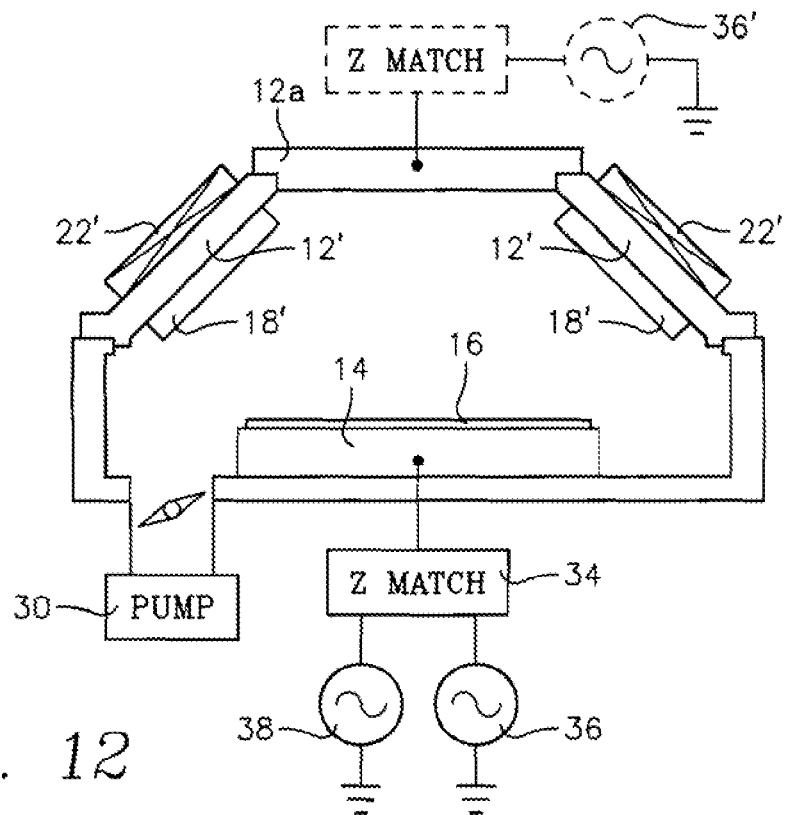
FIG. 12 illustrates a plasma reactor in accordance with a first alternative embodiment.

The metal target 18 may assume a shape different from the disk shape illustrated in FIG. 1. For example, as shown in FIG. 12, a modified target 18' having an annular shape may be employed, leaving a center portion 12a of the ceiling 12 exposed and an annular portion 12' blocked by the target 18'. The overlying magnetron 22' has a corresponding annular configuration. Optionally, VHF plasma source power may be applied to the ceiling center portion 12a by an additional VHF source power generator 36' (dashed line in FIG. 12). This may be in addition to or in lieu of the VHF source power generator 36 coupled to the wafer support pedestal 14. However, it is preferred to couple VHF source power to the pedestal 14 rather than to the ceiling 12.

Figure 13:
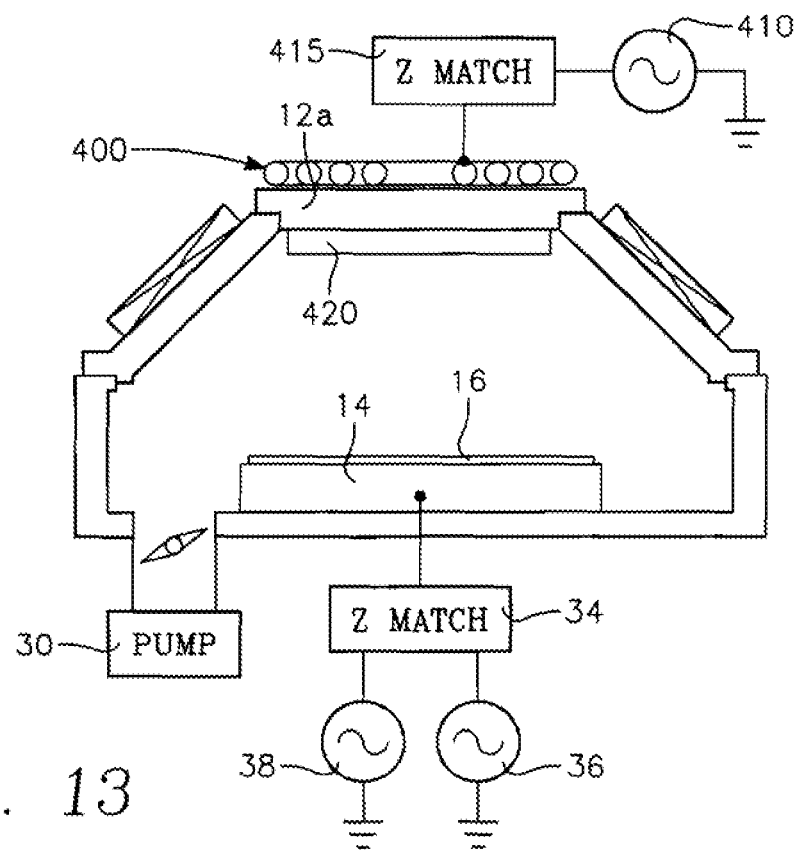
FIG. 13 illustrates a plasma reactor in accordance with a second alternative embodiment.

FIG. 13 depicts another option, in which a coil antenna 400 may be placed over the ceiling center portion 12a and coupled to an RF source power generator 410 through an impedance match circuit 415 to produce an inductively coupled plasma. A louvered shield 420 may cover the ceiling center portion 12a during metal deposition to avoid metal coverage of the ceiling center portion 12a, so that the coil antenna 400 will not be shielded from the plasma.

Figure 14:
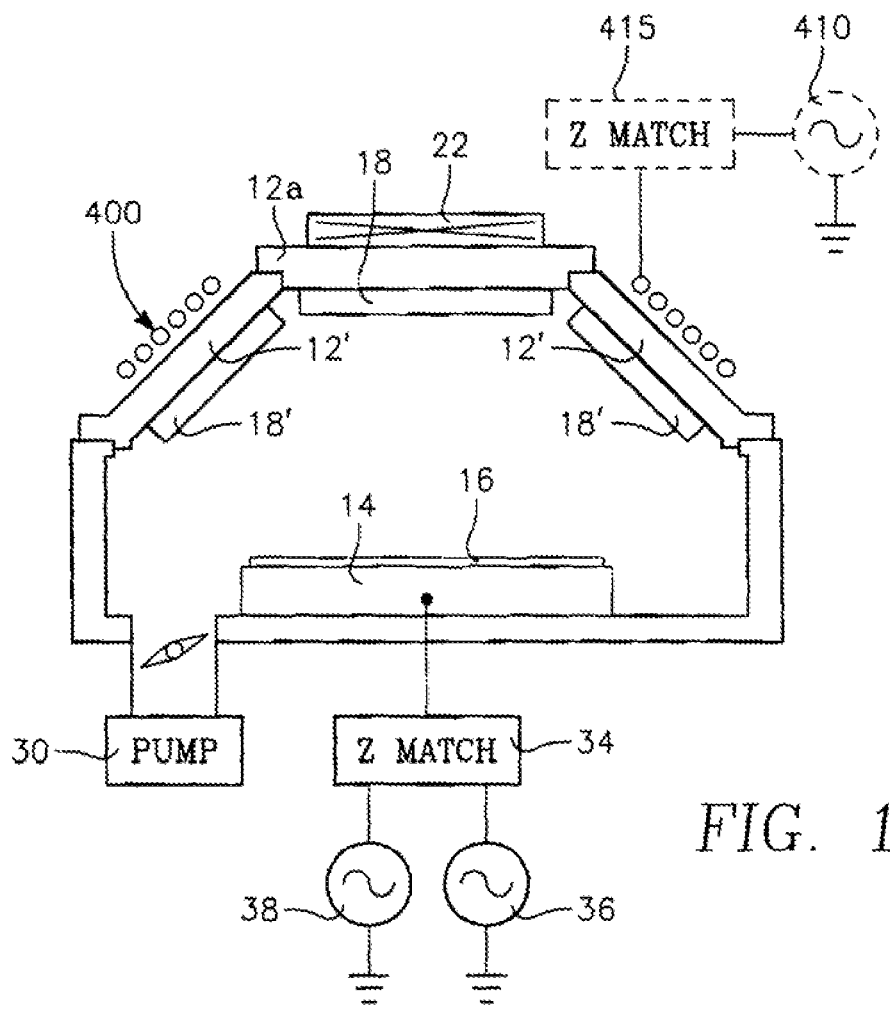
FIG. 14 illustrates a plasma reactor in accordance with a third alternative embodiment.

FIG. 14 illustrates how the configuration of the coil antenna 400 and target 18' may be reversed from that illustrated in FIG. 13. In FIG. 14, the coil antenna 400 is in an annular shape while the disk-shaped target 18 is located at the ceiling center portion 12a. The reactor of FIG. 14 may be modified as follows: The annular coil antenna 400 may be removed and the peripheral portion 12' of the ceiling 12 may be conductive and coupled to the VHF plasma source power generator 410 through the impedance match circuit 415, as indicated in dashed line in FIG. 14.

Figure 15:
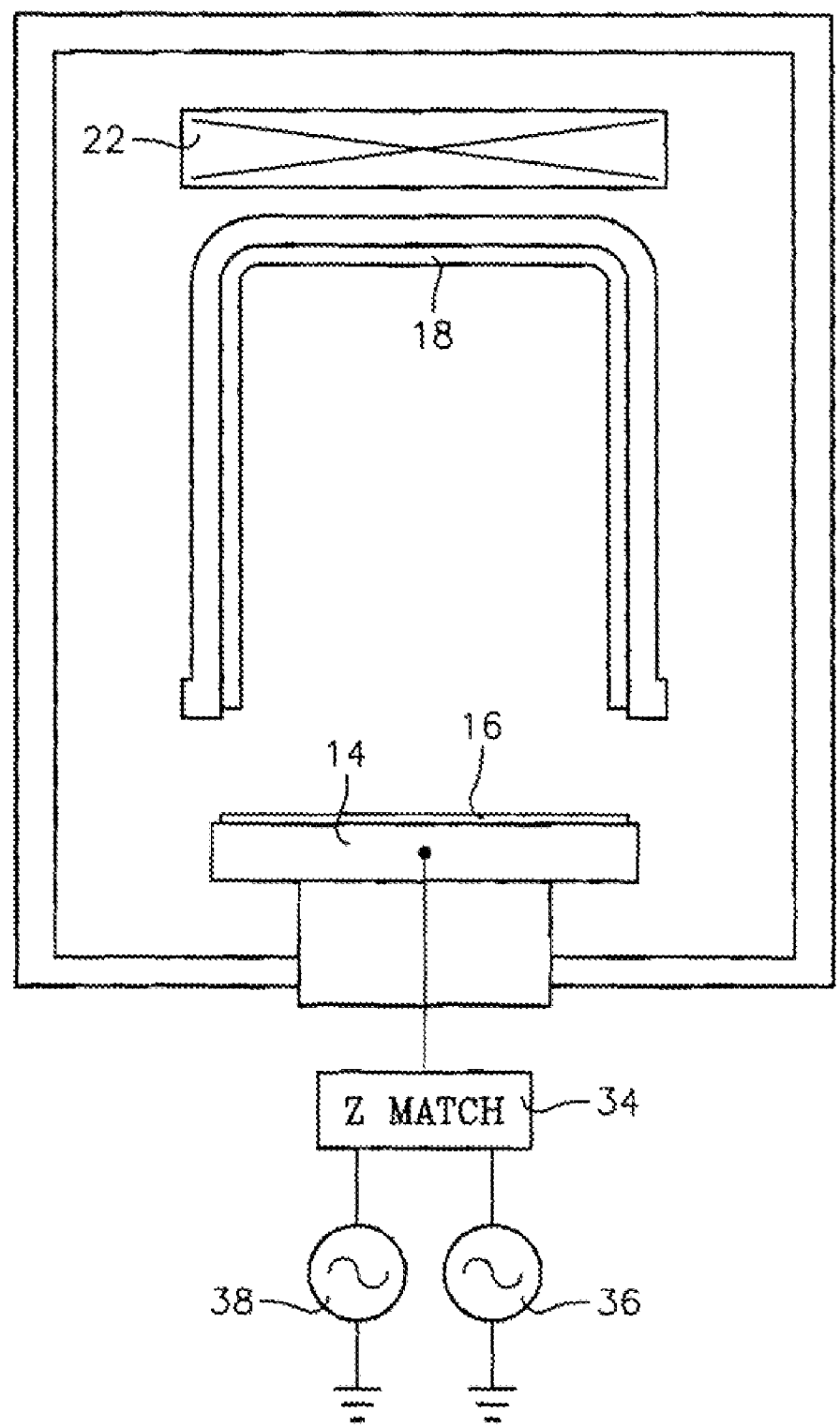
FIG. 15 illustrates a plasma reactor in accordance with a fourth alternative embodiment.
Figure 16:
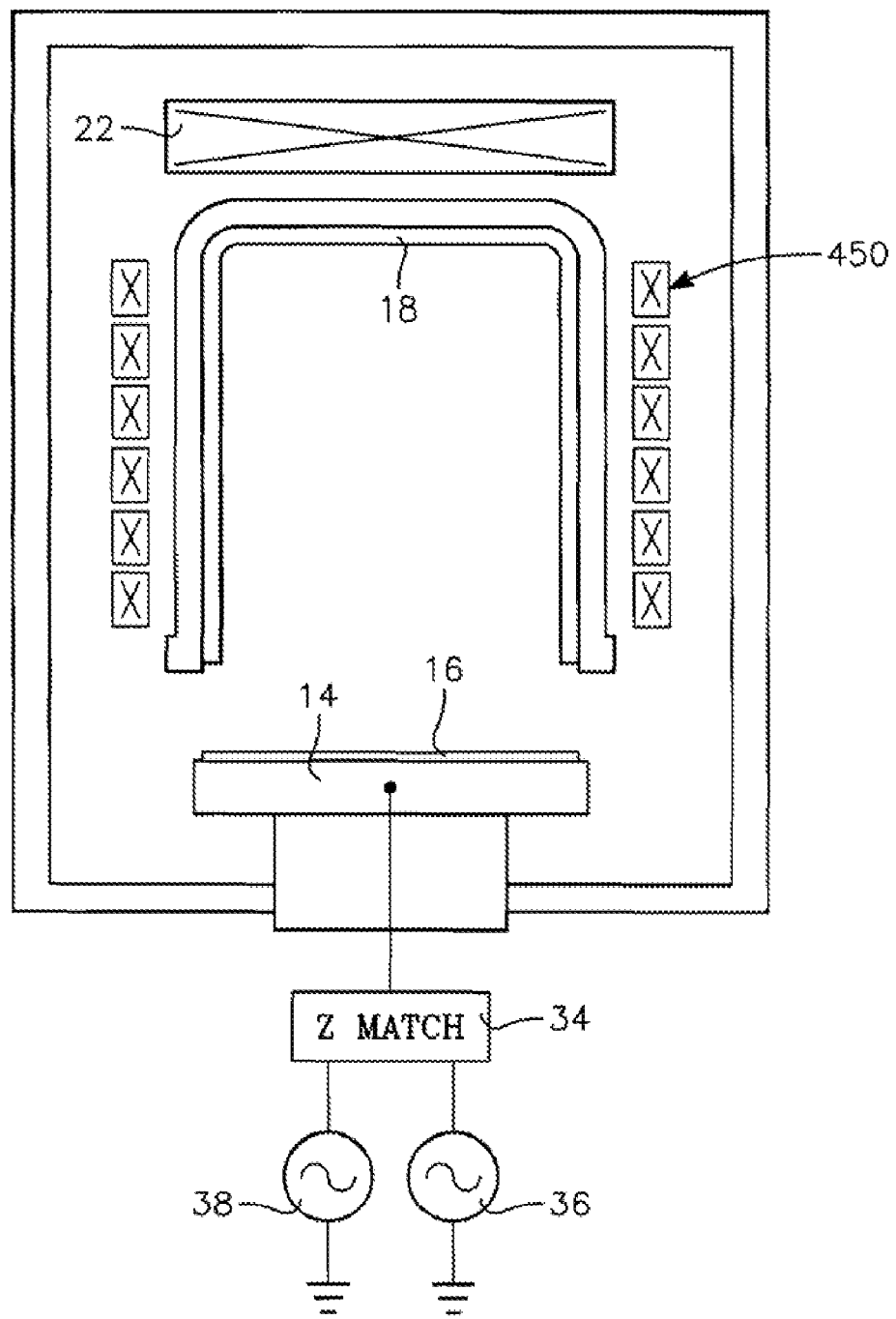
FIG. 16 illustrates a plasma reactor in accordance with a fifth alternative embodiment.

FIG. 15 illustrates another alternative embodiment in which the target 18 is configured in an inverted cup shape. As shown in FIG. 16, the cup shape may be of sufficient height to accommodate an array of magnets 450 along its side to enhance ion distribution.

Figure 17:
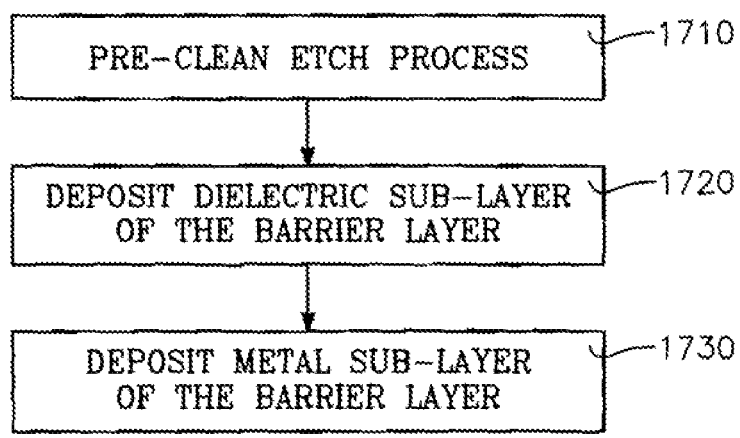
FIG. 17 depicts a process in which the reactor of FIG. 1 performs a pre-deposition cleaning process, a dielectric barrier layer deposition process and a metal barrier layer deposition process on the same wafer.

FIG. 17 is a flow diagram of a process carried out in the PVD/re-sputter chamber of FIG. 1. In the step of block 1710, a pre-clean process is performed by applying no power to the metal target, introducing an etchant precursor gas such as a fluorine-contain gas or a neutral gas such as argon, applying sufficient VHF plasma source power to the wafer from the VHF generator 36 and applying a small amount of HF bias power to the wafer from the HF generator 38. In the following step of block 1720, the dielectric film (e.g., TaN) of a barrier layer is deposited by introducing nitrogen gas and sputtering the metal target (e.g., tantalum) while re-sputtering by maintaining the VHF-driven argon plasma near the wafer and applying bias power to the wafer. In the next step (block 1730), the metal film of the barrier layer is deposited by stopping the supply of nitrogen gas, so that pure metal is deposited while the VHF-driven argon plasma performs re-sputtering. Thus, three successive processes may be performed in the PVD re-sputter reactor of FIG. 1 without removing the wafer from the reactor.

Use of the shield 20 in the reactor of FIG. 1 with the VHF source power supply 36 can be problematic. This is because process control can be lost due to uncontrolled plasma generation on the outside of the shield. This can occur because the RF return path for plasma near the wafer periphery is along the inside (wafer side) surface of the shield 20 and up to the top of the shield 20, and then down the inside surface of the chamber side wall 10 (traveling the entire height of the side wall 10) and along the bottom of the chamber body to the wafer support pedestal 14. At a VHF frequency such as 60 MHz, this RF return path exceeds more than one wavelength, so that along the path there will be several standing wave peaks of the VHF source power at which plasma is likely to be generated. To the extent such a peak falls on the outside of the shield 20, plasma will be generated on the outside of the shield 20, outside of the wafer processing zone enclosed by the shield 20. Such uncontrolled plasma generation will divert RF source power from the wafer process, causing a loss of process control.

This problem is solved by providing the RF connection bridge or conductive tab 60 referred to above with reference to FIG. 2. The RF connection bridge provides an extremely short RF return path between the bottom edge of the shield 20 and the conductive base 51 of the wafer support pedestal 14. The RF return path for plasma over the wafer 16 near the bottom of the shield 20 is therefore much shorter than the VHF source power wavelength, so that there are no standing wave peaks along the shield, and therefore no undesirable plasma generation along surface of the shield 20.

Figure 18A:
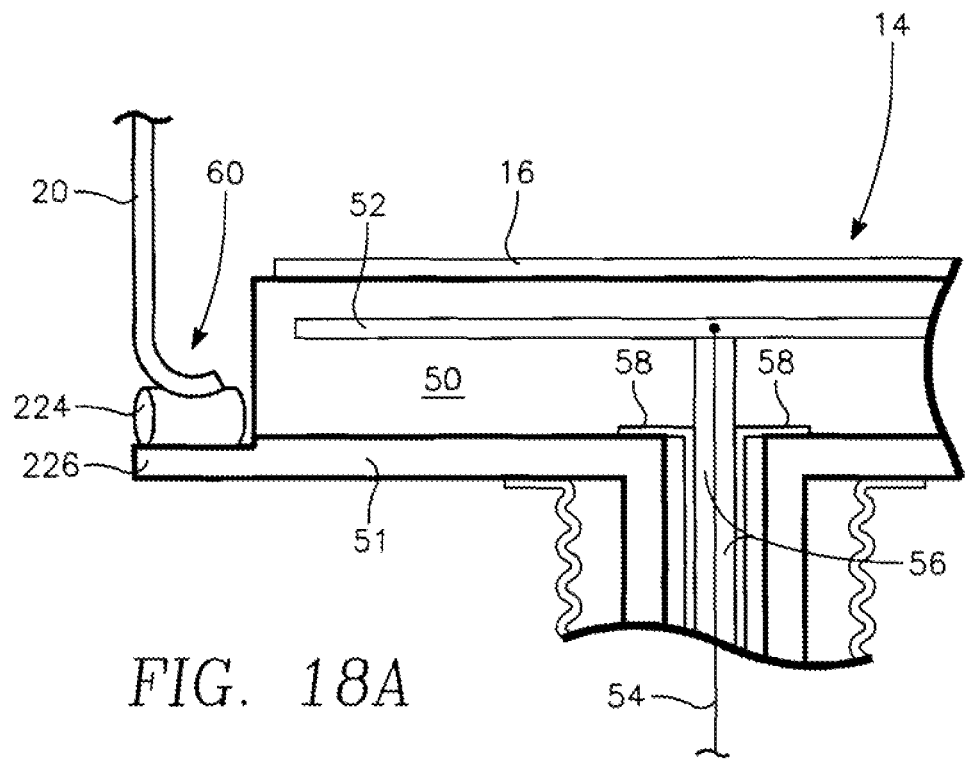
FIGS. 18A and 18B illustrate one embodiment of an RF grounding conductive tab of FIG. 2.
Figure 18B:
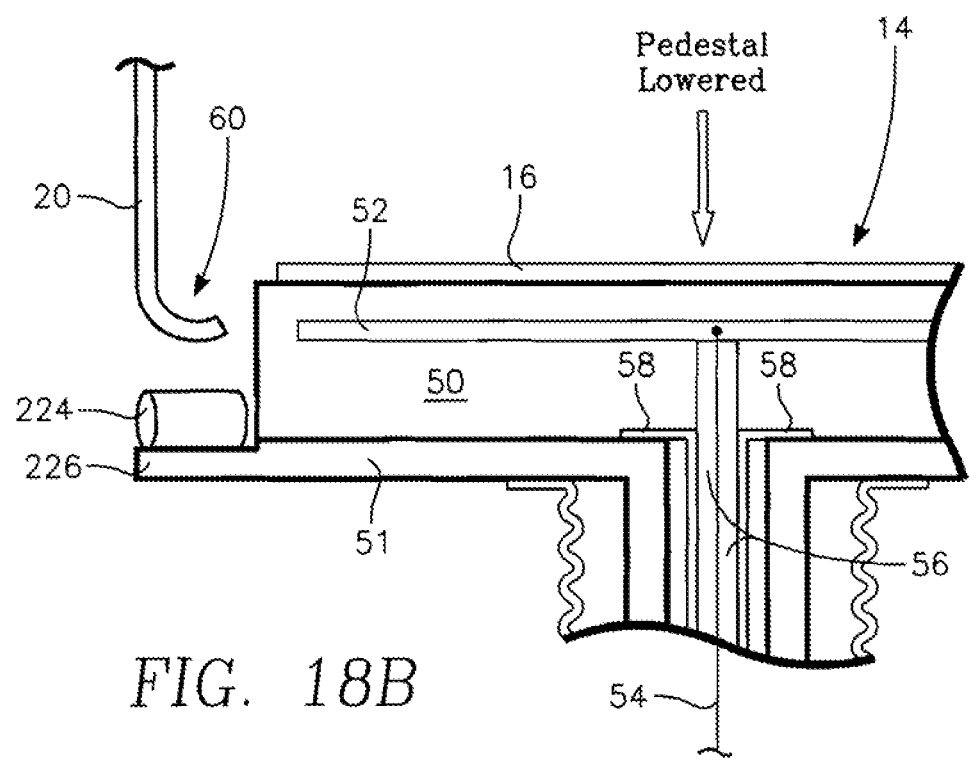

FIGS. 18A and 18B illustrate a preferred embodiment of the connection bridge or tab 60 as an elastically deformable cylindrical spring 224 formed of a conductive material (e.g., copper). The cylindrical spring 224 is supported on a conductive table 226 that is connected to the conductive base 51 of the wafer support pedestal 14. As shown in FIG. 18A, when the pedestal 14 is raised to the top position (where it is held during processing), the cylindrical spring 224 is pressed against the bottom edge of the shield 20 so as to be elastically deformed to at least partially conform with the shape of the bottom corner of the shield 20, thereby providing a very low resistance connection to the shield 20. This path extends from the shield 20 through the tab 60 and radially along the base 51 to the coaxial outer conductor 58 of the coaxial RF feed to the pedestal. In FIG. 18B, the pedestal 14 has been withdrawn to a lower position, allowing the cylindrical spring 224 to return to its undeformed cylindrical shape. The cylindrical axis of the spring 224 lies generally parallel with the plane of the wafer 16.

Copper Deposition Using a Single VHF Frequency:

The reactor of FIG. 1 may be used to deposit copper, such as the copper seed layer 114 of FIG. 7, for example. This is accomplished by using copper instead of tantalum as the metal target 18 in the reactor of FIG. 1. However, using the reactor of FIG. 1 for copper deposition involves special problems. One problem involves undesirable formation (during copper deposition) of an overhanging copper protrusion or "neck" on the sidewall of each narrow aspect ratio opening or via (of the type illustrated in FIG. 8B). Specifically, it is more difficult in a copper deposition process to prevent formation of a metal neck or protrusion on the sidewall. The neck is formed from copper sputtered from the top corner edge of the opening onto the opposing surface of the sidewall. Such an overhanging metal formation neck near the top of the opening (FIG. 8B) tends to protrude into the narrow opening or via, eventually enclosing an unacceptable void at the bottom of the opening by closing off the opening. Sputtering is mainly caused by the carrier gas (Argon) ions. Sputtering of the top corner edge of the via or narrow opening is very high relative to other features because the sputtering rate is maximum for ion incidence angles between 30 and 50 degrees. Using a carrier gas such as Argon to promote the formation of kinetic electrons (for VHF plasma generation near the wafer), we have found it difficult to find a process window of power levels of the VHF and HF power sources 36, 38 in which overhang formation or close-off of the opening is avoided. It seems that the HF bias power required to direct a sufficient flux of copper atoms to the bottom of the via opening (for good bottom coverage) has the undesired effect of creating intense re-sputtering of copper from the top corner edge of the narrow opening onto the opposing sidewall surface of the opening to create the problematic copper protrusion on the sidewall (resulting in a deposition profile similar to that illustrated in FIG. 8A). As the sidewall protrusion grows, it can pinch-off the opening thereby preventing deposition of copper on the floor of the opening. This problem likely is caused by two factors:

First, such harmful re-sputtering of the copper from the top corner edge is worse at higher ion energy levels. This is a serious problem because the HF and LF bias power frequencies of FIG. 1 produce a wide ion energy distribution having significant components at very high ion energies (e.g., an ion energy component corresponding to the peak-to-peak bias voltage).

Secondly, selection of a bias power level sufficient to accelerate a sufficient amount of copper ions to the via floor necessarily accelerates many more times that number of argon atoms to the wafer, which sputter away the copper atoms from the top corner edge of the narrow opening. This happens because copper and argon have (for present purposes) fairly similar atomic masses, so that the effect of the bias voltage in accelerating ions across the plasma sheath at the wafer will be about the same for both copper and argon. This is problematic because, due to the limited efficiency of the target 18 of FIG. 1 as a source of copper, there can be one (or more) orders of magnitude more Argon ions present than Copper ions, so that Argon sputtering of Copper overwhelms the deposition process. In some cases, sputtering by Argon ions can also reach the via floor and compete with copper deposition on the via floor.

We have solved this problem (at least for 65 nm feature size design rules) by applying only VHF source power from the VHF source 36 while applying no HF or LF bias power from the HF/LF source 38. In the preceding description of this specification, a similar mode of operation of the reactor of FIG. 1 was mentioned in which no HF or LF bias power is applied. At nominal VHF power levels (e.g., 100 Watts to 300 Watts), such a mode produces a non-conformal metal deposition (characterized by a relatively thin sidewall coverage) due to lack of re-sputtering without HF or LF bias power.

However, this mode is rendered highly conformal by compensating for the lack of HF or LF bias power by increasing the VHF source power level to a medium level or a high level, until achieving a requisite flux of ions perpendicular to the wafer surface (i.e., parallel to the axis of each high aspect ratio opening) to obtain the desired re-sputtering effects. We have found this achieves the highly conformal effects of the now-missing HF or LF bias power. We have discovered that the lack of HF or LF bias power may be completely compensated by increasing the VHF source power level in this manner. This is believed to be because the VHF source power level from the VHF source 36 of FIG. 1 may be increased to the point at which good via floor coverage from direct copper deposition and good sidewall coverage by copper re-sputtering is obtained. (The re-sputtering effect is discussed at length in previous portions of this specification.) This is possible because increasing the VHF source power level does not significantly increase ion energy but mainly increases the flux of copper ions. This is particularly true if the VHF source power frequency is particularly high, e.g., 60 MHz. Increasing source power at such a VHF frequency does not appreciably increase ion energy at the wafer surface because the frequency is too high for ions to follow the oscillations. Instead, the principal portion (or all) of the source power is consumed in generating kinetic electrons from the carrier gas (which are sufficiently light to follow the source power oscillations). This principal portion is preferably-greater than at least 50%. This principal portion may be around 80% at a source power frequency of 60 MHz. As a result, the undesirable effects of HF or LF bias power are avoided while conformal copper deposition is achieved.

The increase in VHF power required to achieve the foregoing effect may be significant. The nominal power range of VHF power at which deposition is non-conformal lies in a range of about 50-300 Watts, depending upon chamber design and other process parameters (pressure, gas composition, gas flow rate, etc.). The desired degree of deposition conformality may be achieved in this novel single frequency conformal mode by increasing the VHF power to a medium level, between approximately 300 to 800 Watts. In some cases, it may be necessary to increase the VHF power to a high level (800-1500 Watts) before realizing a desired degree of conformality. The increase in VHF power required to carry out this single frequency conformal mode is readily ascertained empirically by measuring deposition conformality at increasing VHF power levels.

In summary, a new copper deposition mode of the reactor of FIG. 1 is one in which the metal target 18 is copper, and the only RF power source employed is the VHF plasma source power supply 36. No plasma bias power is applied (i.e., RF power having a sufficiently low frequency to be followed by ions such as copper). In this single frequency mode, the VHF source power level is increased to reach a high degree of conformality in the deposited copper layer. Specifically, the VHF source power is increased until a sufficient flux of copper ions at the wafer is achieved to provide good copper coverage on the floors of high aspect ratio openings with sufficient re-sputtering to provide adequate sidewall copper coverage. As in the other modes disclosed previously in this specification, the High Voltage D.C. supply 24 and the magnetron 22 need only provide a medium amount of power, and the copper plasma generated near the target 18 may or may not be self-ionizing.

Dual Frequency Copper Deposition Modes:

While the single frequency copper deposition mode described immediately above is effective at feature sizes as small as 65 nm, it is felt that copper deposition at smaller feature sizes (e.g., 45 nm, 35 nm) are best accomplished using an HF or LF bias in combination with VHF source power. As discussed above, the VHF power may be increased to increase the flux of copper ions without a proportionate increase in ion energy. This advantage is enhanced by increasing the VHF source power frequency from 60 MHz to 81 MHz. With such an elevated frequency, the principal portion of the source power dedicated to kinetic electron generation (to generate plasma ions) is as high as 90% or 95%, almost none of it increasing ion energy. Thus, the VHF source power level may be increased to an even greater degree (without a significant harmful increase in ion energy) in order to increase copper ion flux at the wafer to increase copper deposition at the via floor and enhance uniform copper re-sputtering for uniform deposition on the via side walls. This feature reduces the required HF bias power level for a conformal copper deposition. For example, the required HF power level may be reduced from 5 kwatts to 3 kWatts, and in some cases to even lower levels (e.g., 1 k Watt). By reducing the HF bias power level, undesirable copper sputtering by ions of the carrier gas (e.g., argon) is reduced accordingly. It should be noted that the HF bias power is of a sufficiently low frequency so that ions near the plasma sheath readily follow its oscillations so that nearly all of its power is consumed in accelerating ions toward the wafer and thereby increasing ion energy.

In order to regulate or prevent re-sputtering of the copper from the top corner via edge to the via sidewall by ions of the carrier gas (e.g., argon ions), a carrier gas is employed having a much lower atomic mass than copper. Specifically, a light inert gas (helium) is employed as the carrier gas. Although helium has a low atomic mass, it nevertheless suffices nearly as well as argon to produce, under the stimulation of the VHF source power, sufficient kinetic electrons to produce an adequate copper plasma near the wafer surface. If the carrier gas ions are much lighter than the copper ions, then they do not sputter copper atoms from the via top corner edge onto the via sidewall at such a fast rate. This feature therefore achieves enhanced control of the re-sputtering process. In some embodiments employing a higher bias power level, there is an additional problem of Argon ions sputtering deposited copper atoms from the via floor faster than the copper deposition rate. This additional problem is solved by using the lighter (Helium) carrier gas, because the lighter Helium atoms do not produce such a high copper sputter rate. As a result, the re-sputtering of copper from the top corner via edge to the via sidewall is better regulated or controlled. Furthermore, the additional problem (encountered in some cases) of removing copper from the via floor by the more populous carrier gas ions is eliminated or at least reduced. An inert gas such as helium is selected because it introduces no additional chemical reactions or effects and does not chemically react with the deposited copper.

Another problem unique to copper deposition is that the surface of the deposited copper has a relatively high surface energy, and is active (like a fluid) during plasma enhanced deposition, enabling it to reduce its surface energy by accumulating into small globs or balls of copper on the surface. The result is formation of a low-quality copper surface. This problem is solved by adding to the carrier gas a species that combines with copper bonds on the deposited copper surface (on the wafer) to reduce the copper surface energy. The preferred choice for such a surface energy-reducing agent is hydrogen. In the helium plasma, diatomic hydrogen molecules dissociate into monatomic hydrogen, which adheres to open copper atomic bonds in the surface of the deposited copper layer. This surface reaction reduces the copper surface energy, allowing the deposited copper atoms to flow during deposition in thin uniformly flat layers, thereby forming a uniformly smooth high quality copper surface.

This embodiment is also effective for removing copper oxide from the deposited copper, or for preventing formation of copper oxide during processing. In removing copper oxide, the hydrogen reduces the copper oxide, capturing oxygen atoms to form water molecules that are released into the chamber.

The hydrogen gas may form as much as 10% of the process gas. If the reactor is specially constructed to handle pure hydrogen gas, then hydrogen gas may constitute all or nearly all of the process gas.

The bias power window or range within which the copper deposition rate at the 65 nm via floor exceeds the neck growth rate on the sidewall is a "65 nm window". The bias power window or range within which the copper deposition rate at the 45 nm via floor exceeds the neck growth rate on the sidewall is a "45 nm window", which is significantly narrower than the 65 nm window because of the greater aspect ratio of the opening. Within each of these windows, the copper floor deposition rate exceeds the sidewall neck growth rate sufficiently to allow copper deposition on the via floor to reach a target thickness (e.g., 50-500 Angstroms) before the sidewall copper neck pinches off the opening. The problem was that these windows either did not exist or were too narrow for practical operation.

One way in which the process window is widened in the present invention is by increasing the VHF source power level, which increases the flux of copper ions without a concomitant increase in sputtering or neck growth rate. Another way of widening the process window is to employ a low-atomic mass carrier gas species (Helium). This tends to decrease the neck growth rate by reducing sputtering. Using a low atomic mass carrier gas also tends to increase the copper deposition rate at the via floor, by preventing the removal of deposited copper from the floor surface by sputtering from the carrier gas.

Another advantage of the VHF source power is that it further widens the process window by at least partially masking the nonuniformity in radial distribution of the HF (or LF) bias power. In some cases, bias power radial distribution is non-uniform across the wafer surface, which restricts the allowable. RF power range (to avoid exceeding process limits in any radial location on the wafer), thereby narrowing the bias power process windows. At least partially masking this nonuniformity by applying VHF source power reduces this effect, thereby preserving a wider process window.

In summary, a highly conformal layer of copper is deposited on the floor and sidewall of high aspect ratio openings in the dual frequency reactor of FIG. 1. For this process, the metal target 18 of FIG. 1 is copper. The process gas is about 80% to 95% helium and about 5% to 10% hydrogen. The bias power is either an LF or HF frequency (or a combination of both) at a preferred level of about 20-40 Watts, or under 100 Watts. The source power is a VHF frequency of about 60 MHz, although superior performance may be achieved using a VHF source power frequency of 81 MHz. Similarly, in all of the embodiments described above in this specification, the VHF source power frequency may be increased to 81 MHz to improve process performance. This may allow the VHF source power level to be further increased in order to enhance process performance without increasing the ion energy.

Figure 19:
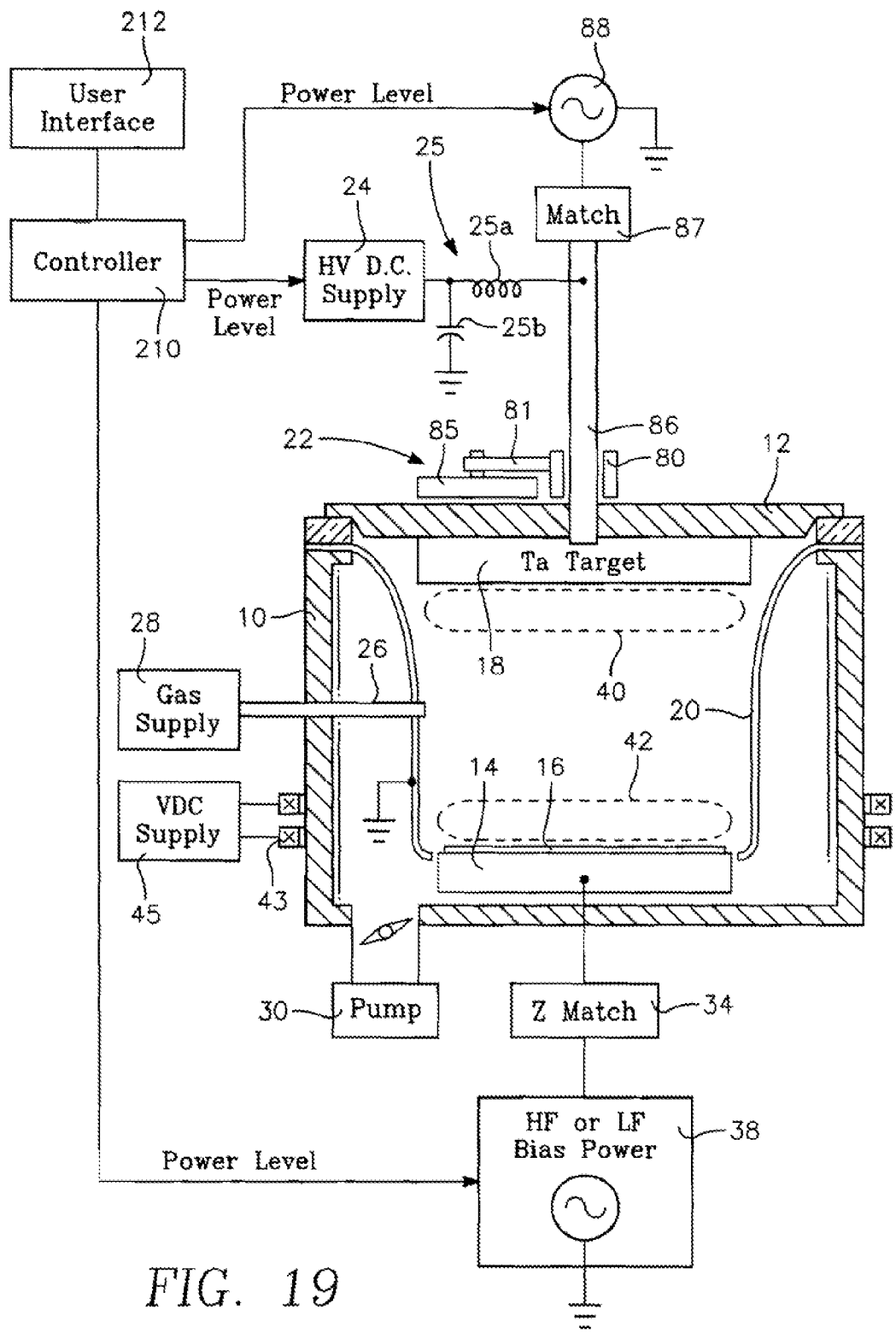
FIG. 19 is a diagram of a first preferred embodiment of a PVD reactor having an electrostatic chuck and a highly efficient VHF radiator and employing a rotating magnet array on the sputtering target.

PVD Reactor with ESC and Efficient VHF Radiator:

In the reactor of FIG. 19, the low efficiency and low power capacity of the electrostatic chuck as a VHF radiator is circumvented by integrating the sputter target and rotating magnet in a highly efficient VHF radiator having high maximum VHF power capability.

Referring to FIG. 19 now, the reactor includes a vacuum chamber defined by a cylindrical side wall 10, a disk-shaped ceiling 12, and a wafer support pedestal 14 for supporting a semiconductor wafer 16 to be processed. A target 18 of a metal (e.g., copper) to be deposited on the wafer 16 is mounted on the ceiling 12. A process kit consisting of a cylindrical shield 20 surrounds the wafer 16 and the target 18. A rotating magnet ("magnetron") 22 of the conventional type overlies the target 18 on the external side of the ceiling 12. A high voltage D.C. source 24 is coupled to the target 18 through a low-pass filter 25 that includes a series inductor 25a and a shunt capacitor 25b. A process gas injector 26 furnishes process gas from a supply 28 into the interior of the chamber. A vacuum pump 30 maintains a desired sub-atmospheric pressure in the vacuum chamber.

The wafer pedestal 14 is coupled through an impedance match network 34 to an HF or LF plasma bias power generator 38. The LF bias power applied to the wafer determines the selectivity of the re-sputter/etch process for horizontal surfaces. Plasma uniformity is enhanced by an electromagnetic coil 43 wrapped around the cylindrical sidewall of the reactor chamber and supplied with D.C. current by a current source controller 45.

The wafer support pedestal 14 is an electrostatic chuck (ESC) of the type illustrated in FIG. 2. Referring to FIG. 2, the wafer support pedestal 14 of FIG. 19 consists of an insulating layer 50 mounted on a conductive base 51 and an electrode 52 such as a conductive mesh buried inside the insulating layer 50. The pedestal structure can extend downwardly in a coaxial arrangement consisting of a center conductor 54 connected to the electrode 52, an insulating intermediate layer 56 and an outer conductor 58 connected to the conductive base 51. The conductive base 51 can be coupled to the bottom of the cylindrical shield 20 by conductive tabs 60 to provide a more continuous ground reference. The center conductor 54 is coupled through an isolation capacitor 76 to the RF match 34 while the outer conductor 58 is grounded. The impedance match network 34 is coupled to the RF (HF or LF) plasma bias power generator 38. In addition, a D.C. chuck voltage source 74 is connected to the wafer pedestal center conductor 54.

In FIG. 19, the magnetron 22 has a center axle 80 coupled to a center arm 81 that is coupled to a magnet array 85. An electric motor (not shown) produces orbital motion by rotating the center axle 80.

Figure 20:
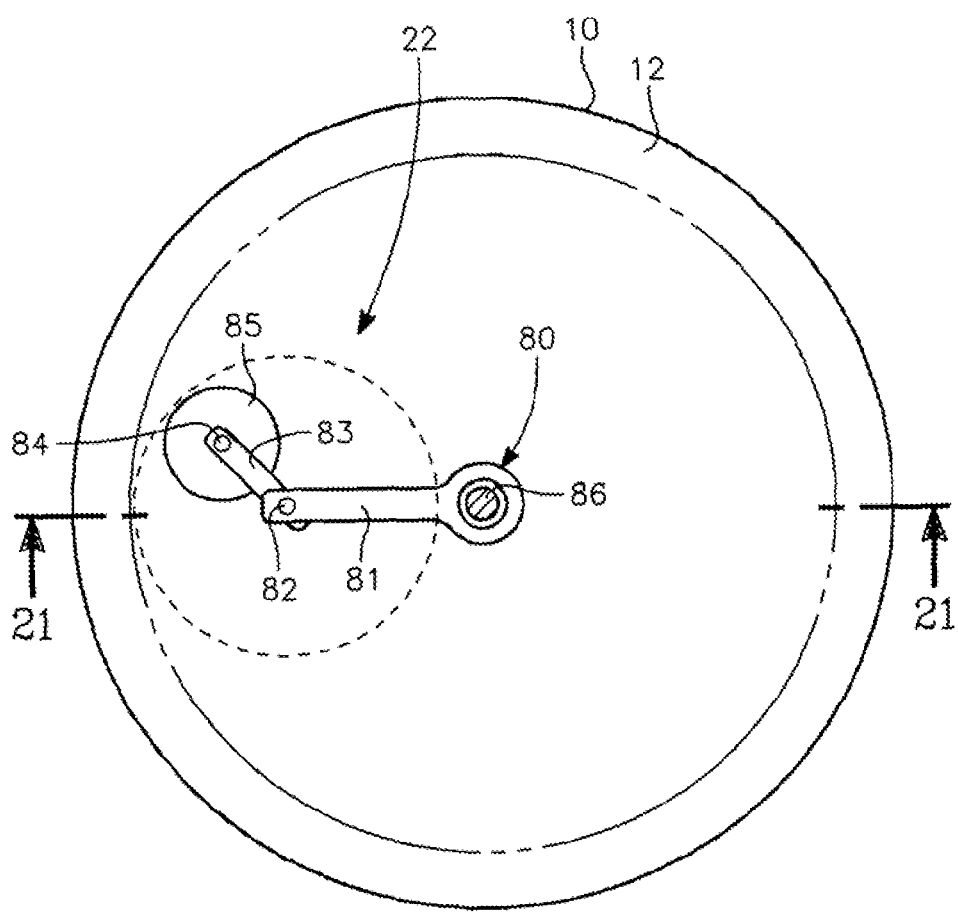
FIG. 20 is a top view corresponding to FIG. 19.

FIG. 20 depicts an alternative embodiment, in which the rotating magnet or "magnetron" 22 has its center axle 80 coupled to the proximal end of the center arm 81, a dual planetary axle 82 connected to the distal end of the center arm 81 and to the proximal end of a planetary arm 83. A dual spin axle 84 is connected to the distal end of the planetary arm 83 and a magnet array 85 that is spun around the axle 84. Planetary motion of the magnet array can be attained through a planetary gear arrangement (not shown).

Figure 21:
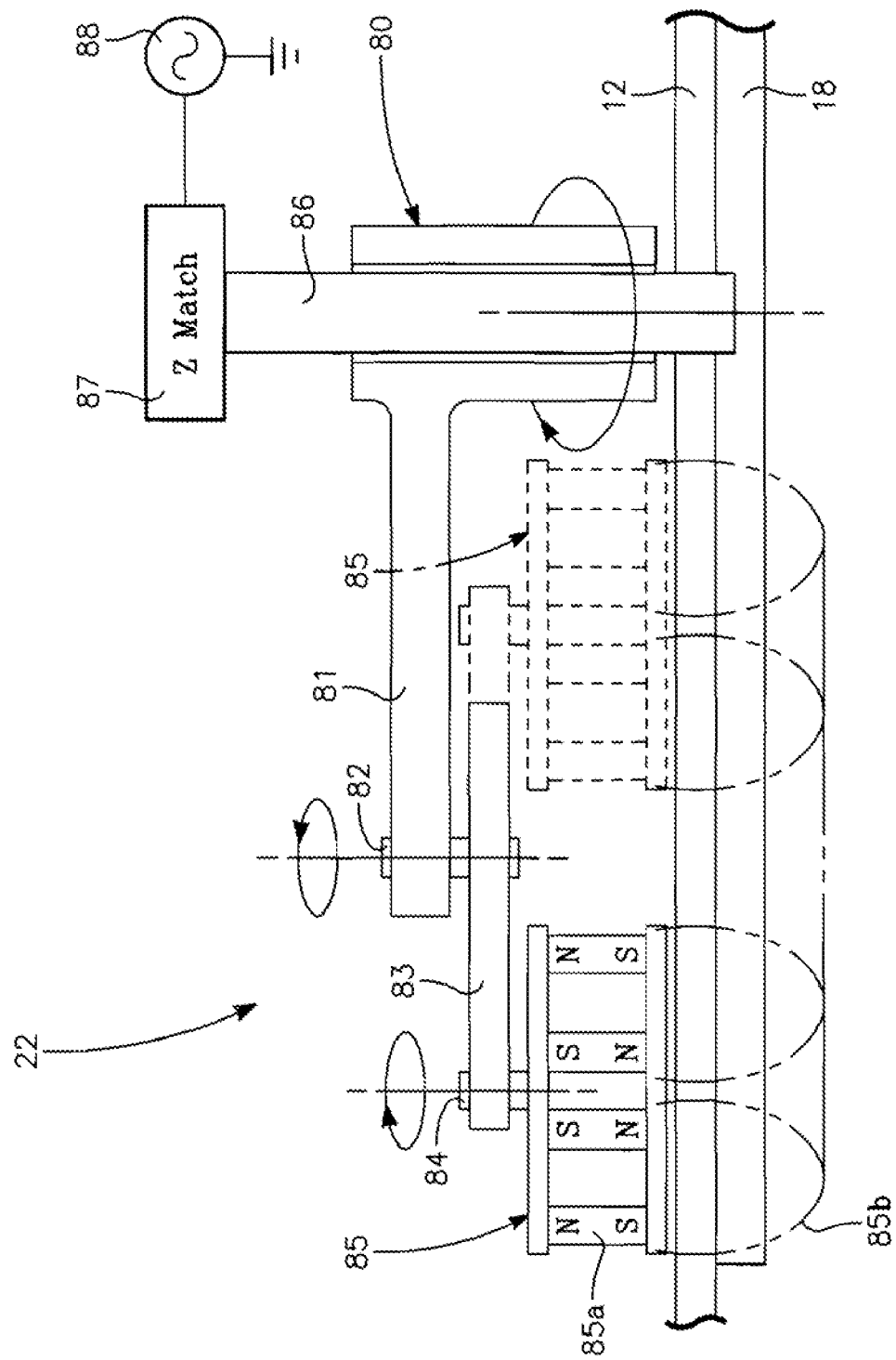
FIG. 21 depicts the toroidal magnetic confinement pattern of the magnet array of FIGS. 19 and 20.

In the preferred embodiment of FIG. 19, the magnets 85a within the magnet array 85 may be permanent magnets arranged symmetrically in the manner of FIG. 21 so as to produce a toroidal confinement pattern of the ions near the target 18, in accordance with the magnetic confinement pattern 85b outlined in dashed line in FIG. 21. In one implementation, the target 18 was nineteen inches in diameter and the magnet array 85 was five inches in diameter.

Figure 22:
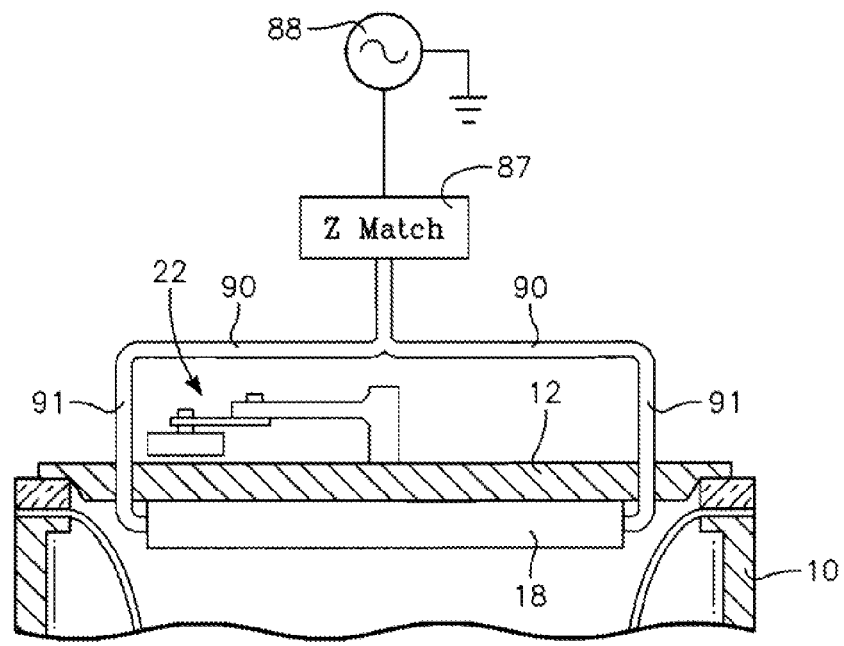
FIG. 22 is a diagram of a second preferred embodiment of a PVD reactor having an electrostatic chuck and a highly efficient VHF radiator and employing a rotating magnet array on the sputtering target.
Figure 23:
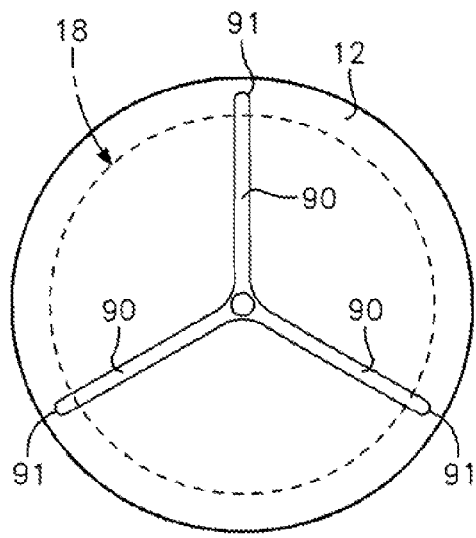
FIG. 23 depicts a first pattern of RF feed columns on the sputter target of the reactor of FIG. 22.
Figure 24:
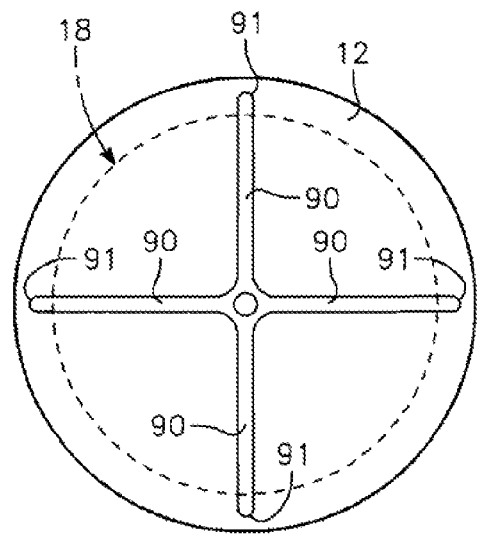
FIG. 24 depicts a second pattern of RF feed columns on the sputter target of the reactor of FIG. 22.

Referring again to FIG. 19, the metal (copper) sputter target 18 and the magnetron 22 are integrated in a highly efficient high power VHF radiator or applicator by providing a relatively thick (0.75 inch diameter) RF rod 86 embedded in the metal target 18 and extending axially through a cylindrical hollow in the center axle 80 and through the ceiling 12. The RF rod 86 may be electrically insulated from the center axle 80. A VHF impedance match circuit 87 is coupled to (or mounted on) the external (top) end of the rod 86 and a VHF source power generator 88 is coupled to the match circuit 87. An output capacitor (not shown) of the RF impedance match 87 isolates the match 87 from D.C. current from the D.C. supply 24. Preferably, the VHF generator 88 applies RF power at a frequency of about 81 MHz at a power level of about 3.5 kW (or more). In one implementation, the target 18 is copper and the RF rod 86 is a 0.75 inch diameter copper rod that is threaded into the target 18. In any case, the copper rod 86 is relatively thick, being at least 0.50 inch in diameter or thicker (0.70 inch or more in diameter). FIG. 22 illustrates another embodiment in which plural RF rods 90 extend radially from the VHF impedance match circuit 87 to axial RF rods 91 that are coupled to the edge of the target 18. In the illustrated embodiment, the RF match circuit 87 is centered relative to the disk-shaped metal target 18, the rods 90 are of a uniform length and the rods 91 are of a uniform length. The RF rods 90, 91 are sufficiently thick (e.g., 0.70 inch in diameter) to provide highly efficient coupling of VHF power and withstand high VHF power levels (e.g., 3.5 kW and above). In the embodiment of FIG. 22, there may be three sets of symmetrically arranged RF rods 90, 91 (as shown in the top view of FIG. 23) or four sets of symmetrically arranged RF rods 90, 91 (as shown in the top view of FIG. 24) or more. In the embodiments of FIGS. 1 and 19, the D.C. power from the source 24 applied to the metal (copper) target 18 initially ionizes the carrier gas (e.g., helium), which starts the sputtering of the metal target 18. A relatively small fraction of the metal atoms sputtered from the target 18 are ionized in this process. Ions of the carrier gas (e.g., helium) produced by the D.C. power and some copper ions are confined at the surface of the target 18 by the field of the magnetron 22 in the toroidal confinement pattern discussed above. The ionization fraction is insufficient for deposition on floors of high aspect ratio openings on the wafer. In order to provide a very high ionization fraction (e.g., in excess of 80%) that is capable of such deposition, VHF power is employed to ionize the neutral metal atoms sputtered from the target 18. For this purpose, in the embodiment of FIG. 1, VHF power was coupled to the wafer to generate a VHF plasma near the wafer surface, which was possibly separate from the plasma generated at the target 18 by the D.C. power applied to the target. In FIG. 1, the maximum VHF power level was severely limited by the fine geometry of the mesh electrode of the ESC, thus limiting the maximum ionization fraction at the wafer to as low as 20% in some cases. We feel that an optimum ionization fraction for deposition in high aspect ratio openings of a 65 nm or 45 nm feature size is closer to or in excess of 80%. Therefore, in order to overcome the limitation of the ESC, in the embodiment of FIG. 19 the VHF power is applied to the target 18 through the thick RF rod 86, as described above. The thickness of the metal target 18 and the thickness of the RF rod 86 is such that very high levels of VHF power may be applied to the target 18 and, moreover, the target 18 is a relatively efficient VHF radiator. As a result, VHF power delivered to the plasma may be nearly tripled, in some cases. The wafer-to-target spacing can now be reduced, as the invention achieves a good level of ionization at a controllable deposition rate, without the need for a large spacing.

In operation, the ionization fraction is no longer limited (e.g., below 20% in some cases) by the low power threshold and efficiency of the ESC 14, and instead very high levels of VHF power may be applied by the VHF generator 88. The resulting high ionization fraction (e.g., greater than 80% in some cases) eliminates the need for very high D.C. power from the supply 24 while enabling, for the first time, deposition of highly conformal coatings in very high aspect ratio openings or vias. Preferably, the D.C. target power level is in a range of about 1000 Watts to 2500 Watts. However, the deposition rate can be tightly controlled and set at very low levels by reducing the D.C. target power from the supply 24 to very low levels (for example, 500 Watts or less), while using the VHF power boost the ionization fraction to the desired level. This reduces the metal deposition rate sufficiently to eliminate the need for a large wafer-to-target spacing. Heretofore, without the use of VHF power, the high level of D.C. power required to attain the desired ionization fraction produced uncontrollably high deposition rates unless the wafer-to-ceiling distance was increased to about 400 mm (to increase the deposition time to a mere 7 seconds). With VHF power and D.C. power driving the target 18, the wafer-to-target spacing may be reduced to 50-70 mm or less (for example, for processing a 300 mm diameter wafer). The result is that there is very little (or no) decrease in ionization fraction from the VHF-driven metal target 18 to the wafer. In this way, the VHF plasma, generated by driving the (copper) target 18 with the VHF generator 88, is very close to the wafer, so that there is no need to apply VHF to the ESC 14 for sufficient ionization at the wafer. The D.C. power may be reduced as desired without appreciably reducing ionization fraction, provided the VHF power is not reduced. Therefore, it is preferable to reduce or limit the D.C. power to obtain a highly controllable deposition rate at the wafer, e.g., a deposition process that requires on the order of a minute (in contrast to the earlier techniques that afforded a deposition process time on the order of only seconds and which was therefore difficult to control).

Application of HF power to the ESC 14 to generate an adequate rate of re-sputtering of copper from horizontal surfaces or corners onto the high aspect ratio opening sidewalls has been discussed previously in this specification. The HF power level required for this purpose is sufficiently low so that the limitations of the ESC 14 (e.g., the fine mesh electrode) do not limit the re-sputtering process. Therefore, the HF power for controlling re-sputtering is applied through the ESC 14 in the reactor of FIG. 19.

An advantage of reducing the wafer-to-ceiling spacing is that the surface area of the shield 20 is reduced, which reduces the amount of sputtered metal (e.g., copper) that is wasted by depositing on the shield instead of the wafer. As a result, the metal target 18 and the shield 20 can be used to process a greater number of wafers (e.g., 20,000 wafer) before being replaced, thus reducing the per-wafer cost of operating the reactor. This represents an improvement of about an order of magnitude.

Applying D.C. power and VHF power to the target 18 simultaneously while applying HF or LF power to the ESC 14 facilitates the independent simultaneous control of three key parameters: deposition rate, ionization fraction and re-sputtering (re-flow) rate. The deposition rate is controlled by the level of D.C. power applied to the target 18 by the D.C. supply 24. The ionization fraction is controlled by the level of VHF power applied to the target 18 by the VHF generator 88. The re-sputter rate is controlled by the level of HF (or LF) power applied to the ESC 14 by the HF (or LF) generator 38. In a preferred operating mode, very low D.C. power (e.g., less than 500 Watts) is applied to the sputter target for a very low deposition rate, very high VHF power (e.g., over 3.5 kWatts) is applied to the sputter target for a high ionization fraction sufficient for conformal coating in very high aspect ratio openings, and a moderate level of HF power is applied to the ESC 14 to provide an adequate rate of re-sputtering of deposited metal for re-deposition of metal on the sidewalls of high aspect ratio openings. The deposition rate may be increased if desired (by increasing the target D.C. power) up to a limit at which the flux of metal atoms through the VHF-generated plasma exceeds the ionization rate of which the plasma is capable, at which point the ionization fraction decreases significantly. Conversely, the VHF power may be decreased while applying a given level of D.C. power to the target 18, until the same limit is reached at which the VHF-plasma density is overwhelmed by the flux of metal atoms from the target.

In one working example, the VHF power level was 3.5 kW. This induced a relatively small or negligible D.C. voltage on the target 18, so that the deposition rate is controlled almost entirely by the D.C. target power. The D.C. power applied to the target 18 in this example was 500 Watts, the D.C. supply furnishing about 300 Volts and about 1.5 Amperes.

In one embodiment, the reactor of FIGS. 19 and 20 was employed for plasma enhanced physical vapor deposition of copper, the target 18 being copper. Helium gas was employed as the carrier gas to moderate the re-sputter rate at the wafer, and hydrogen was included in the process gas (up to about 10% hydrogen) to prevent de-wetting of the deposited copper on the sidewalls of high aspect ratio openings. The reactor of FIGS. 19 and 20 may be used to deposit barrier layers (such as a tantalum nitride barrier layer and/or a tantalum barrier layer). In such a case, the target 18 is tantalum (or titanium or other suitable barrier metal). For a deposition of a tantalum nitride barrier layer, nitrogen gas is introduced into the chamber.

Figure 25:
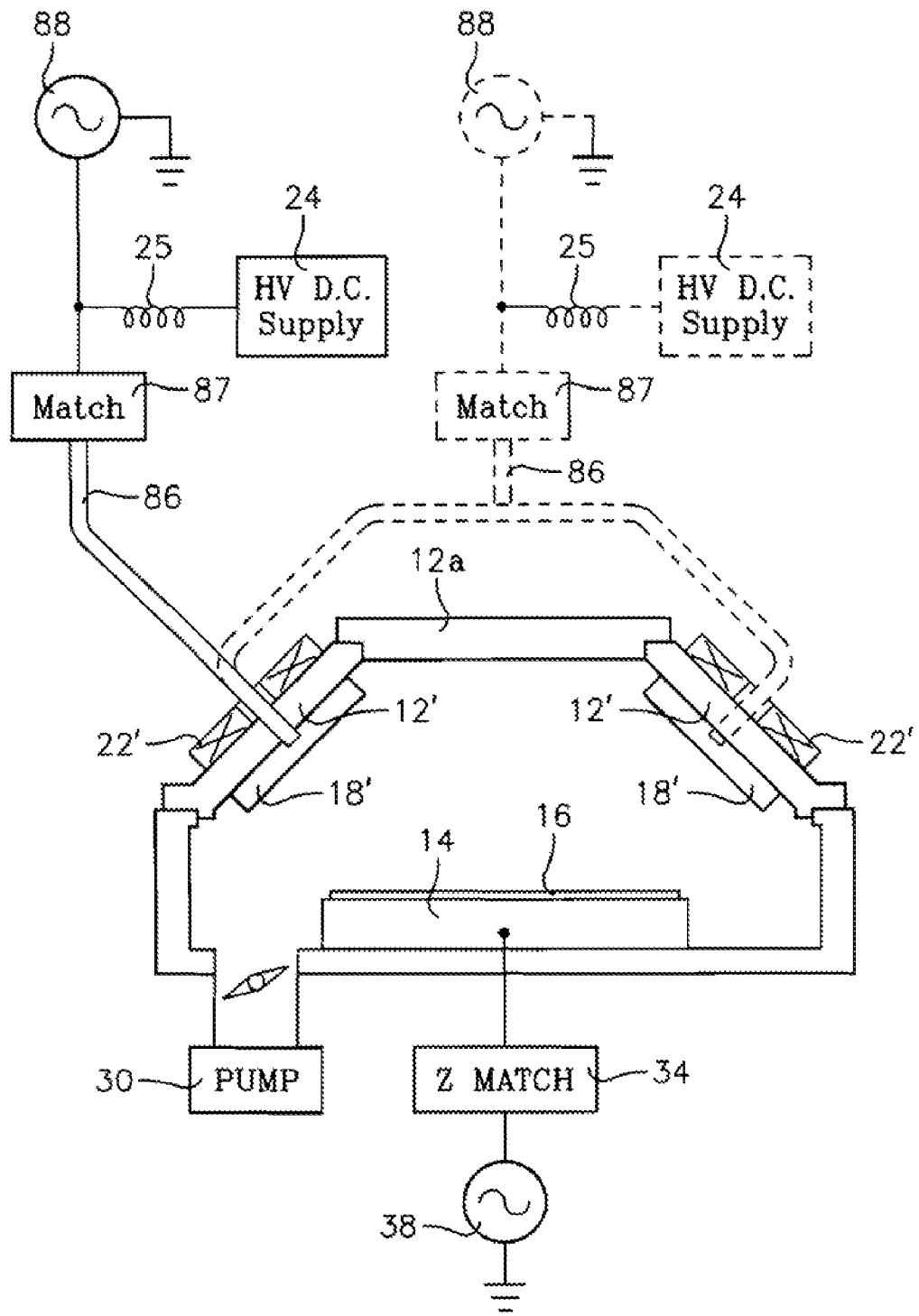
FIGS. 25, 26 and 27 depict first, second and third alternative embodiments, respectively.

As illustrated in FIG. 25, the metal sputtering target may be shaped as a truncated cone 18' surrounding a flat circular ceiling 12a. The RF rod 86 engages the target 18' in a manner similar to that of FIG. 19, but is necessarily off-center because of the target shape. An alternative symmetrical or centered arrangement is suggested in dashed line, in which the VHF source 87, 88 is axially centered and feeds the target through multiple RF rods 86 that may be evenly spaced.

Figure 26:
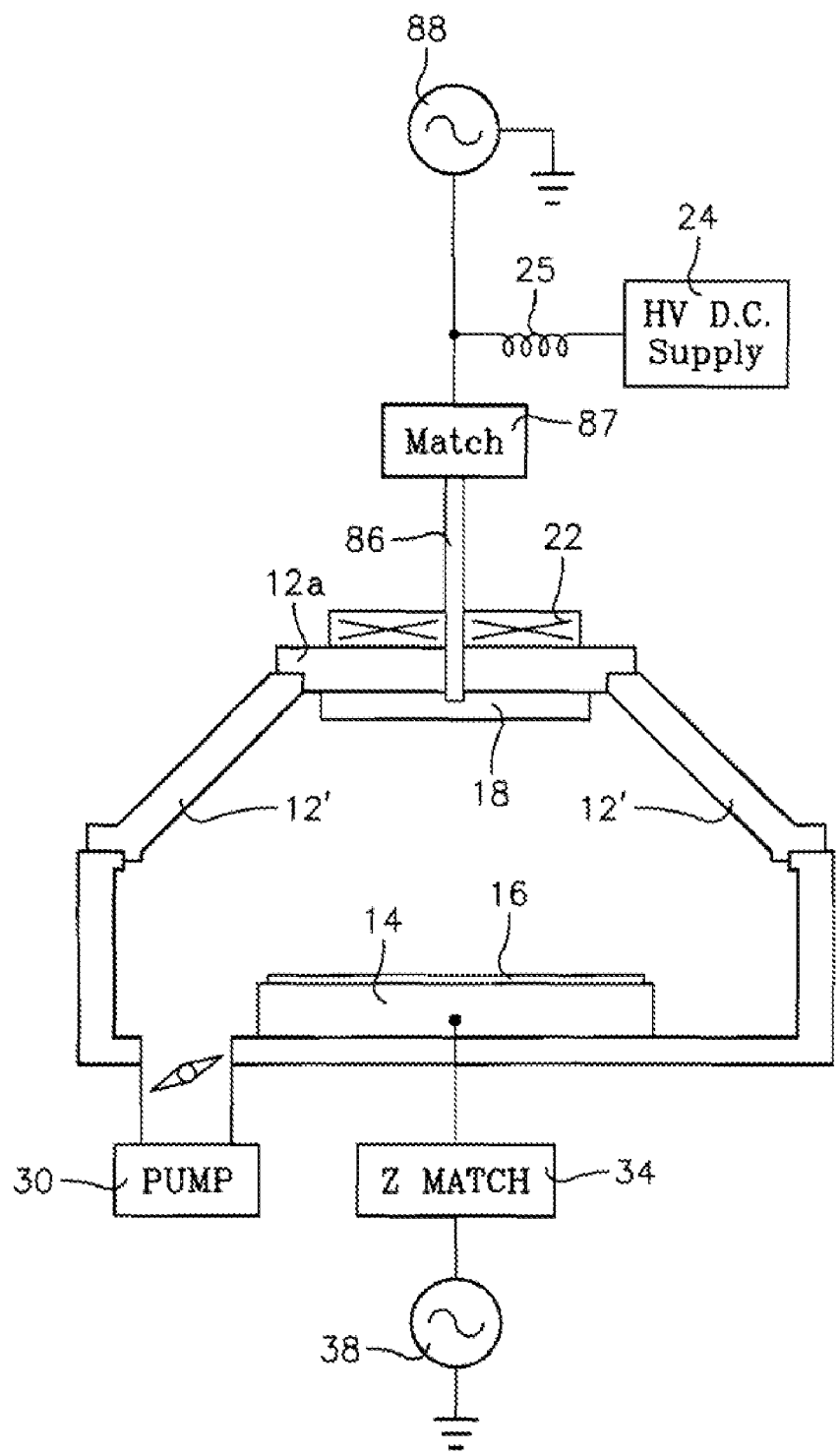

As illustrated in FIG. 26, the target 18 may be in registration with the centered circular ceiling 12a and surrounded by the truncated conical ceiling section 12'. One option (not illustrated in FIG. 26) is to provide an inductive antenna over the truncated conical ceiling section 12' in the manner of FIG. 14.

Figure 27:
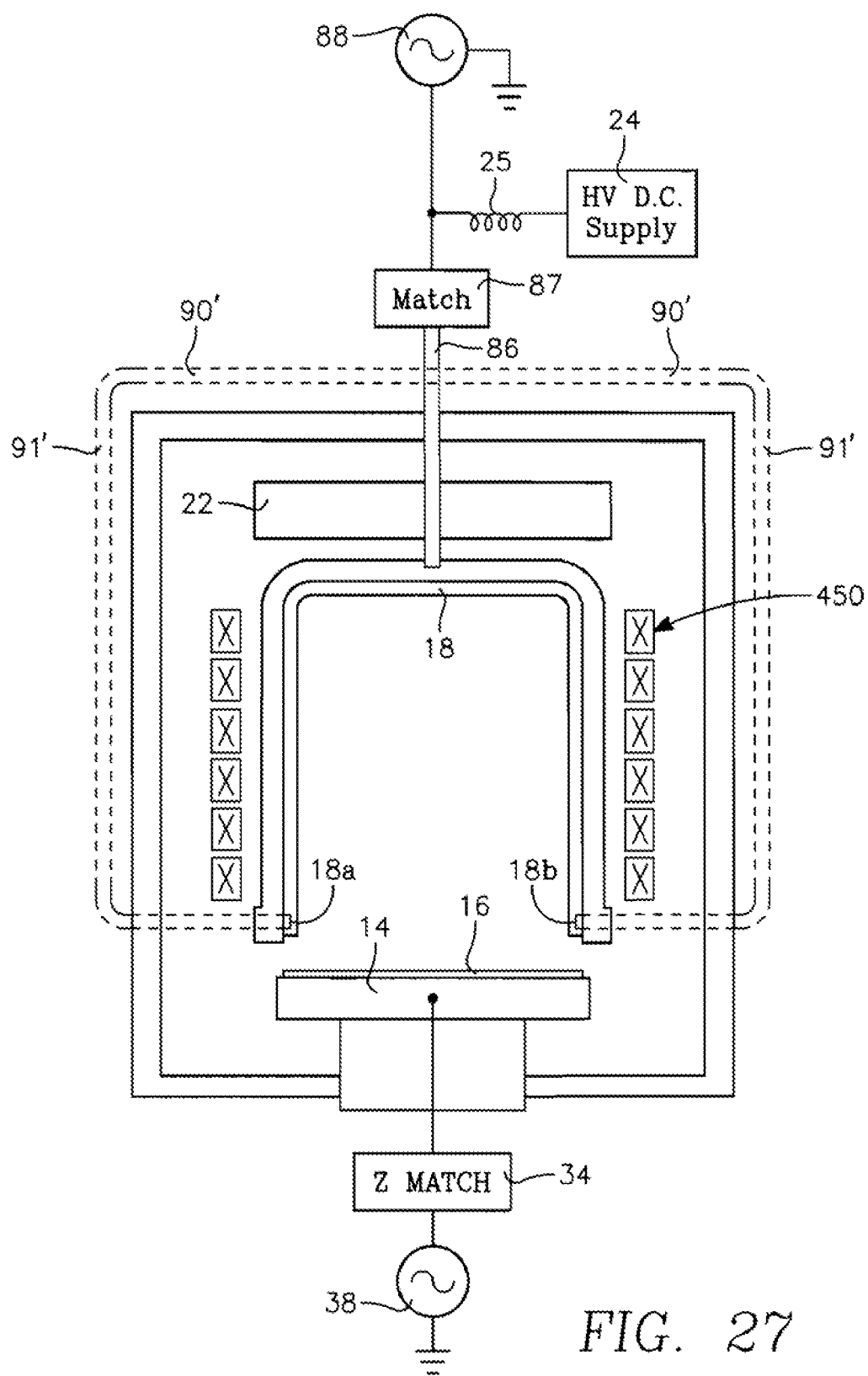

As illustrated in FIG. 27, the metal sputtering target 18 may be shaped as an inverted bell or "U" shape, in the manner of FIG. 16. In one implementation, the RF rod 86 extends upwardly from the center of the target, as illustrated in solid line in FIG. 27. However, a preferred way may be to feed the VHF power at plural evenly spaced feed points 18a, 18b along the periphery of the U-shaped target 18 of FIG. 27, through radial and axial RF rods 90', 91' as indicated in dashed line.

Figure 28:
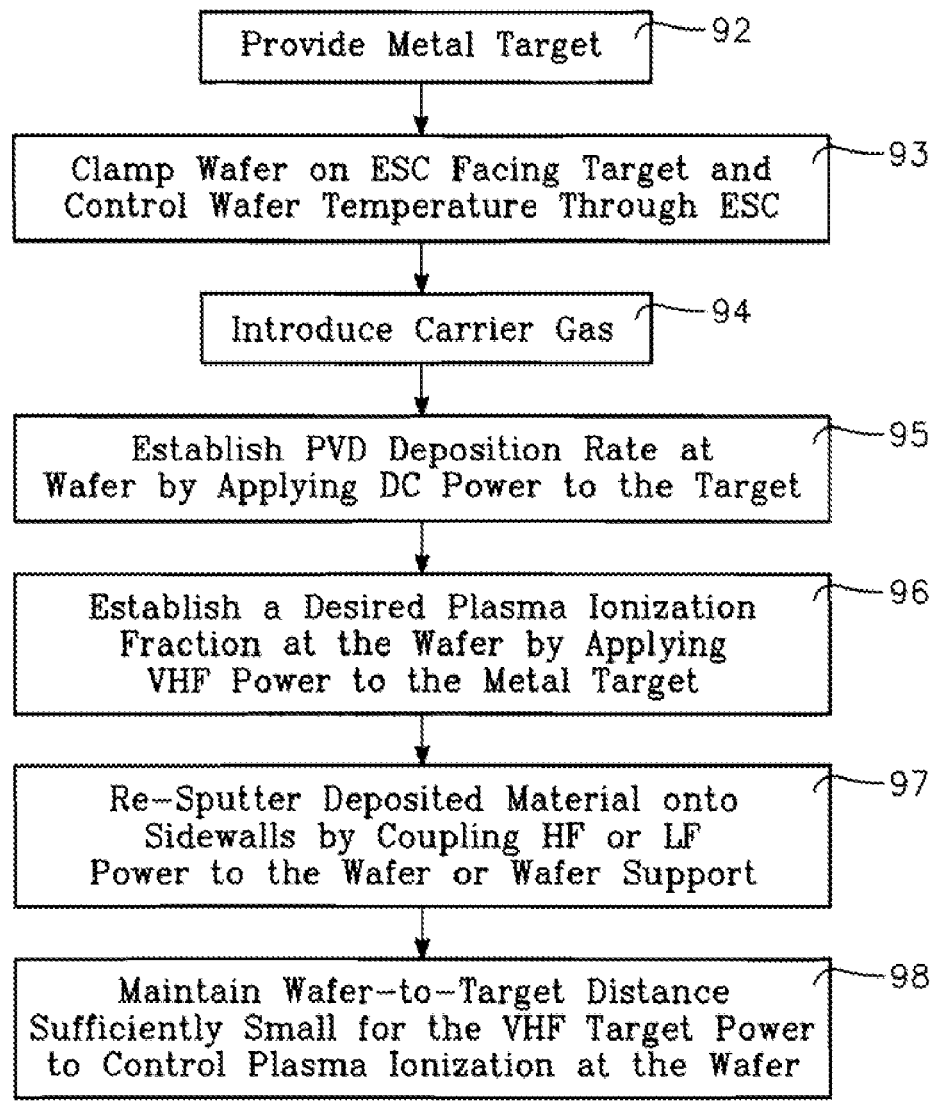
FIG. 28 depicts a process for carrying out physical vapor deposition in accordance with one aspect of the invention.

The flow diagram of FIG. 28 illustrates a method of performing physical vapor deposition of copper onto an integrated circuit in a vacuum chamber of a plasma reactor, as follows: providing a copper target near a ceiling of the chamber (block 92 of FIG. 28), placing an integrated circuit wafer on a wafer support pedestal facing the target near a floor of the chamber (block 93), introducing a carrier gas into the vacuum chamber (block 94), establishing a deposition rate on the wafer by applying D.C. power to the copper target (block 95), establishing a desired plasma ionization fraction near the wafer by applying VHF power to the copper target (block 96), promoting re-sputtering of copper on vertical surfaces on the wafer by coupling HF or LF power to the wafer (block 97), and maintaining a sufficiently small distance between the wafer and the target so that the VHF power control plasma ionization fraction at the surface of the wafer (block 98).

A similar process may be employed using the reactor of FIG. 19 to deposit a barrier layer, such as tantalum and tantalum nitride barrier layers, prior to copper deposition. For this purpose the target 18 is tantalum. In order to deposit a tantalum nitride barrier layer, nitrogen is added to the process gas.

Arcing Suppression:

As discussed above, the ground strap 60 of FIG. 2 was introduced to prevent arcing at the shield 20. The shield is necessary to prevent deposition of material from the target 18 (Cu or Ta) on the chamber walls. Arcing was not generally a problem for 200 mm diameter wafers. However, it was found that a PVD reactor for processing 300 mm wafers typically has significant arcing problems. The arcing arises from the long RF return path that exists in the absence of the grounding strap 60. This path is illustrated in dashed line in FIG. 1, and extends from the plasma to the interior surface of the shield 20 and down to the bottom of the shield 20, then up the outer surface of the shield 20 to the side wall 10, down the interior surface of the sidewall 10 and thence to the outer coaxial shield. This latter portion of the path is best viewed in FIG. 2 and is indicated in dashed line as extending along the ESC base 51 to the coaxial shield 58. This conductive path is so long that successive voltage peaks and nodes will occur along the path at intervals determined by the frequency of the applied RF power, leading to arcing or ignition of extraneous plasma below the pedestal or outside the shield 20. These effects will cause contamination of the process and uncontrolled diversion of RF power from the process. Although introduction of the conductive grounding strap 60 (FIG. 2) solves the problems of arcing and extraneous plasma ignition, it requires the placement of a number of such straps at intervals along the applied periphery that are less than the wavelength of the applied RF power. For example, three straps 60 placed at 120 degree intervals along the shield periphery may suffice where the applied RF frequency is 13.56 MHz. However, such an array of grounding straps would block access of the wafer to the ESC 14. Therefore, such grounding straps cannot be placed at uniform intervals along the shield periphery, thereby making it difficult to prevent arcing or extraneous plasma ignition.

Figure 29A:
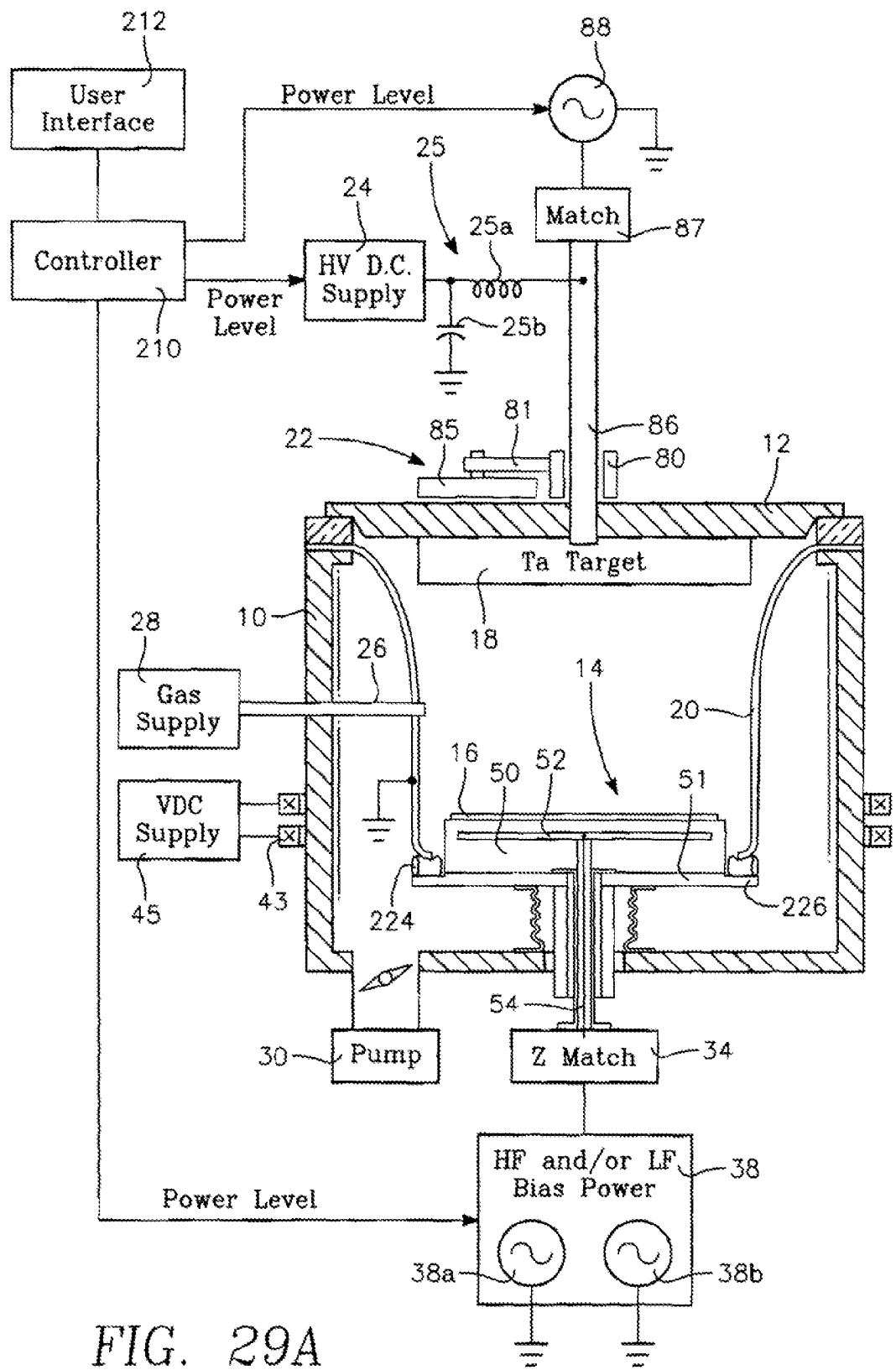
FIG. 29A is an elevational view of a plasma reactor in accordance with one embodiment of the invention.
Figure 29B:
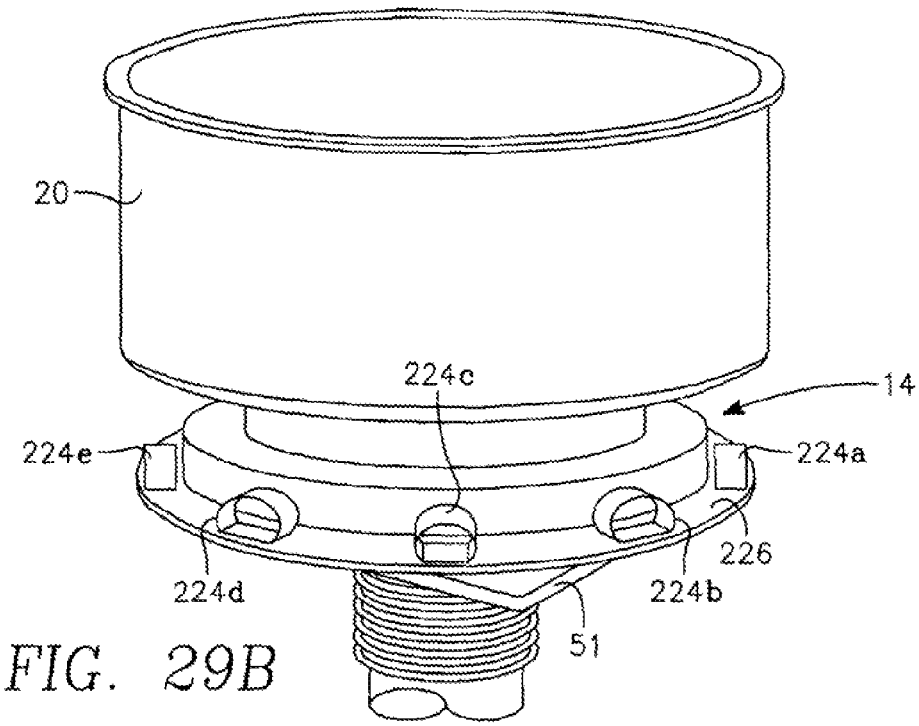
FIG. 29B is a perspective view corresponding to FIG. 29A.
Figure 29C:
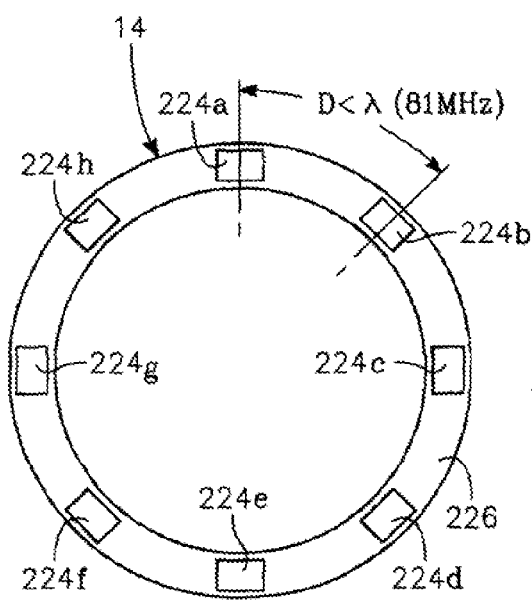
FIG. 29C is a top view corresponding to FIG. 29A.
Figure 29D:
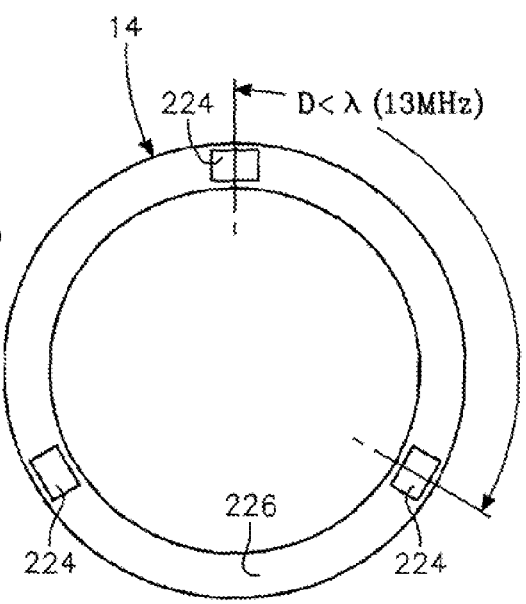
FIG. 29D is a top view corresponding to an alternative embodiment of FIG. 29A.

FIGS. 29A, 29B and 29C are elevational, perspective and top views, of a physical vapor deposition reactor similar to that of FIG. 19 but incorporating an array of compressible grounding tabs 224 of the type depicted in FIGS. 18A and 18B. The perspective view of FIG. 29B depicts the reactor with the ESC in a retracted position at which the compressible tabs 224 are not contacting the shield 20. As shown in the top view of FIG. 29C, for an 81 MHz applied RF frequency, as many as eight compressible conductive tabs 224a-224g are deployed at uniform intervals D around the periphery of the ESC 14, each of the tabs 224 being mounted on the metal flange 226 extending from the ESC base 51. For lower RF frequencies or longer wavelengths, the interval D may be larger, requiring only three tabs 224, as illustrated in the top view of FIG. 29D. The tab-to-tab interval D must be less than the wavelength of the RF power applied by the VHF generator 88 so that the spacing between grounded (zero RF voltage) points prevents formation of resonances or voltage peaks along the shield 20. This interval may need to be substantially less than the free space wavelength at the applied RF frequency because the plasma in the chamber reduces the effective wavelength along the interior surface of the conductive shield 20. The compressible conductive tabs 224 remain below the plane of the wafer 16 when the ESC 14 is retracted, so that there is full access for the wafer to the ESC 14 while the tabs 224 may be placed at uniform intervals to optimize suppression of arcing and of extraneous plasma ignition.

While the invention has been described in detail with reference to preferred embodiments, it is understood that variations and modifications thereof may be made without departing from the true spirit and scope of the invention.

What is claimed is:

1. A physical vapor deposition reactor, comprising:
    a vacuum chamber including a sidewall, a ceiling and a retractable wafer support pedestal near a floor of the chamber, and a vacuum pump coupled to the chamber, said retractable wafer support pedestal having an internal electrode and a grounded base with a conductive annular flange extending from said base, said base and said flange being retractable with said pedestal;
    a process gas inlet coupled to said chamber, said process gas inlet capable of being coupled to a process gas source;
    a metal sputter target adjacent said ceiling, said metal sputter target capable of being coupled to a D.C. voltage source;
    an RF plasma source power generator coupled to said metal sputter target and having a frequency suitable for exciting kinetic electrons;

a removable shield adjacent said sidewall and plural compressible conductive tabs dispersed at generally uniform intervals on said annular flange and in contact with a bottom edge of said annular shield whenever said retractable wafer support pedestal is in an unretracted position, each of said uniform intervals being less than a wavelength corresponding to the frequency of said RE plasma source power generator; and wherein each of said compressible conductive tabs comprises a hollow cylinder formed of a metal layer and has a cylindrical axis parallel to a workpiece support plane of said workpiece support pedestal.

2. The reactor of claim 1 further comprising an RF plasma bias power generator coupled to said internal electrode of said retractable wafer support pedestal, said RF plasma bias power generator having a frequency suitable for coupling energy to plasma ions.

3. The reactor of claim 1 further comprising a solid metal RF feed rod having a diameter in excess of about 0.5 inches engaging said metal sputter target, said RF feed rod extending axially above said target through said ceiling and being coupled to said RF plasma source power generator.

4. The reactor of claim 3 further comprising an RF match circuit coupled between said RF plasma source power generator and said RF feed rod, said RF match circuit being mounted on said RF feed rod.

5. The reactor of claim 3 further comprising a magnet array overlying said ceiling and a center axle about which said magnet array is rotatable, said center axle having an axially cylindrical hollow passageway therethrough, said metal rod extending through said passageway.

6. The reactor of claim 5 further comprising planetary motion apparatus coupled between said magnet array and said center axle, said magnet array comprising an array of magnetic poles arranged to produce a generally toroidal-shaped confinement pattern of ions near said target.

7. The reactor of claim 1 wherein said wafer support and said target are separated by a distance which does not exceed about one fourth of the diameter of said wafer support.

8. The reactor of claim 1 further comprising a removable shield surrounding a processing zone encompassing the wafer support pedestal and separating said processing zone from the sidewall of the chamber.

9. The reactor of claim 1 wherein said metal sputter target comprises copper.

10. The reactor of claim 1 wherein said metal sputter target comprises tantalum.

11. A physical vapor deposition plasma reactor, comprising:

a vacuum chamber including a sidewall, a ceiling and a retractable wafer support pedestal near a floor of the chamber, and a vacuum pump coupled to the chamber, said pedestal having an internal electrode and a grounded base with a conductive annular flange extending from said base, said base and said flange being retractable with said pedestal;

a metal sputter target at said ceiling and a D.C. source coupled to said sputter target and capable of exciting a target-sputtering plasma near said target;

an RF plasma source power generator coupled to said wafer support pedestal and having a frequency suitable for exciting kinetic electrons;

an RF plasma bias power generator coupled to said internal electrode and having a frequency suitable for accelerating ions from said wafer-sputtering plasma across a plasma sheath near said wafer support pedestal;

a removable shield adjacent said sidewall and plural compressible conductive tabs dispersed at generally uniform intervals on said annular flange and in contact with a bottom edge of said shield whenever said retractable wafer support pedestal is in an unretracted position, each of said uniform intervals being less than a wavelength corresponding to the frequency of said RF plasma source power generator; and wherein each of said compressible conductive tabs comprises a hollow cylinder formed of a metal layer and has a cylindrical axis parallel to a workpiece support plane of said workpiece support pedestal.

12. The apparatus of claim 11 further comprising a magnetron overlying said target for confining enhancing said target-sputtering plasma.

13. The apparatus of claim 11 wherein the frequency of said source power generator is a VHF frequency and the frequency of said bias power generator is an HF or LF frequency.

14. The apparatus of claim 13 wherein said bias power generator is set to a power level sufficient to direct ions of said wafer-sputtering plasma to sputter horizontal surfaces on a wafer mounted on said wafer support pedestal and avoid sputtering vertical surfaces on said wafer.

15. The apparatus of claim 13 wherein said target comprises tantalum and said process gas comprises nitrogen.

16. The apparatus of claim 11 further comprising a high pass filter coupled between said source power generator and said wafer pedestal and a low pass filter coupled between said bias power generator and said wafer support pedestal.

17. The apparatus of claim 11 wherein said RF plasma source power generator and said RF plasma bias power generator have respectively adjustable RF power levels.

18. The apparatus of claim 17 further comprising a process power controller coupled to power level control inputs of said D.C. source, said RF plasma source power generator and said RF plasma bias power generator, said process controller being configurable into at least two of three states comprising:

(a) a conformal deposition state comprising a low power level of D.C. source, a high power level of RF plasma source power generator and a low power level of said RF plasma bias power generator;

(b) a non-conformal deposition state comprising a low power level of D.C. source, a high power level of said RF plasma source power generator, and an at least nearly zero power level of said RF plasma bias power generator; and (c) a punch through re-sputter state comprising a low power level of said D.C. source, a high power level of said RF plasma source power generator, and a high power level of said RF plasma bias power generator.

19. The apparatus of claim 11 further comprising an electromagnet coil around said chamber and a D.C. current source coupled to said coil.

* * * * *